United States Patent
Lee et al.

(10) Patent No.: US 10,910,365 B2
(45) Date of Patent: Feb. 2, 2021

(54) STRUCTURE AND METHOD FOR COOLING THREE-DIMENSIONAL INTEGRATED CIRCUITS

(71) Applicant: Taiwan Semiconductor Manufacturing Company, Ltd., Hsinchu (TW)

(72) Inventors: Hui-Yu Lee, Hsinchu (TW); Chi-Wen Chang, Yuanlin Township (TW); Jui-Feng Kuan, Zhubei (TW); Yi-Kan Cheng, Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 16/569,382

(22) Filed: Sep. 12, 2019

(65) Prior Publication Data

US 2020/0006325 A1   Jan. 2, 2020

Related U.S. Application Data

(62) Division of application No. 15/688,050, filed on Aug. 28, 2017, now Pat. No. 10,763,253, which is a (Continued)

(51) Int. Cl.
*H01L 23/34* (2006.01)
*H01L 23/38* (2006.01)
(Continued)

(52) U.S. Cl.
CPC .......... *H01L 27/0688* (2013.01); *H01L 23/34* (2013.01); *H01L 23/38* (2013.01);
(Continued)

(58) Field of Classification Search
CPC ....... H01L 23/38; H01L 35/28; H01L 33/645; H01L 27/16; H01L 21/8221; F25B 21/02
See application file for complete search history.

(56) References Cited

U.S. PATENT DOCUMENTS 5,448,109 A   9/1995  Cauchy
5,831,333 A   11/1998  Malladi et al.
(Continued)

OTHER PUBLICATIONS

Koo, Jae-Mo et al., "Integrated Microchannel Cooling for Three-Dimensional Electronic Circuit Architectures" Journal of Heat Transfer, 127; pp. 49-58, Jan. 2005.

*Primary Examiner* — Cassey D Bauer
(74) *Attorney, Agent, or Firm* — Slater Matsil, LLP

(57) ABSTRACT

A structure and method for cooling a three-dimensional integrated circuit (3DIC) are provided. A cooling element is configured for thermal connection to the 3DIC. The cooling element includes a plurality of individually controllable cooling modules disposed at a first plurality of locations relative to the 3DIC. Each of the cooling modules includes a cold pole and a heat sink. The cold pole is configured to absorb heat from the 3DIC. The heat sink is configured to dissipate the heat absorbed by the cold pole and is coupled to the cold pole via an N-type semiconductor element and via a P-type semiconductor element. A temperature sensing element includes a plurality of thermal monitoring elements disposed at a second plurality of locations relative to the 3DIC for measuring temperatures at the second plurality of locations. The measured temperatures control the plurality of cooling modules.

20 Claims, 15 Drawing Sheets

Related U.S. Application Data division of application No. 14/014,532, filed on Aug. 30, 2013, now Pat. No. 9,748,228.

(51) Int. Cl.
*H01L 27/06* (2006.01)
*H01L 23/00* (2006.01)
*H01L 25/065* (2006.01)
*H01L 35/26* (2006.01)
*H01L 35/18* (2006.01)
*H01L 23/48* (2006.01)

(52) U.S. Cl.
CPC .......... *H01L 24/17* (2013.01); *H01L 25/0657* (2013.01); *H01L 35/18* (2013.01); *H01L 35/26* (2013.01); *H01L 23/481* (2013.01); *H01L 24/05* (2013.01); *H01L 24/13* (2013.01); *H01L 24/16* (2013.01); *H01L 2224/04042* (2013.01); *H01L 2224/131* (2013.01); *H01L 2224/16225* (2013.01); *H01L 2224/17135* (2013.01); *H01L 2225/06517* (2013.01); *H01L 2225/06565* (2013.01); *H01L 2225/06589* (2013.01); *H01L 2924/00* (2013.01); *H01L 2924/014* (2013.01); *H01L 2924/351* (2013.01)

(56) References Cited

U.S. PATENT DOCUMENTS

| | | |
|---|---|---|
| 6,041,850 A | 3/2000 | Esser et al. |
| 6,098,408 A | 8/2000 | Levinson et al. |
| 6,282,907 B1 | 9/2001 | Ghoshal |
| 6,945,054 B1 | 9/2005 | Norman |
| 9,228,763 B2 | 1/2016 | Kim et al. |
| 2004/0195673 A1 | 10/2004 | Zaidman |
| 2006/0001140 A1 | 1/2006 | Lee et al. |
| 2006/0090787 A1 | 5/2006 | Onvural |
| 2012/0153454 A1* | 6/2012 | Liu .................. H01L 21/76898 257/712 |
| 2014/0192835 A1 | 7/2014 | Caroff et al. |

* cited by examiner

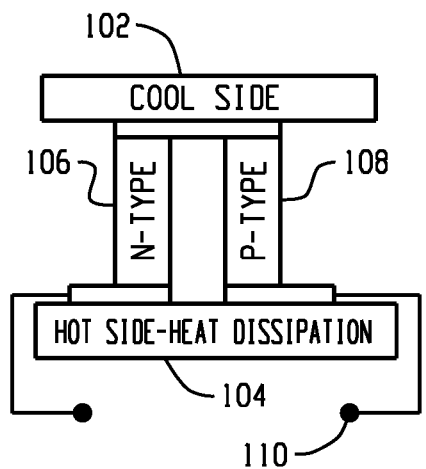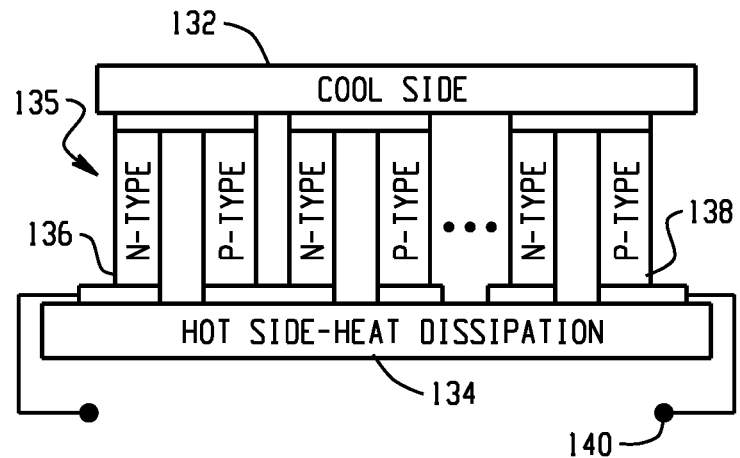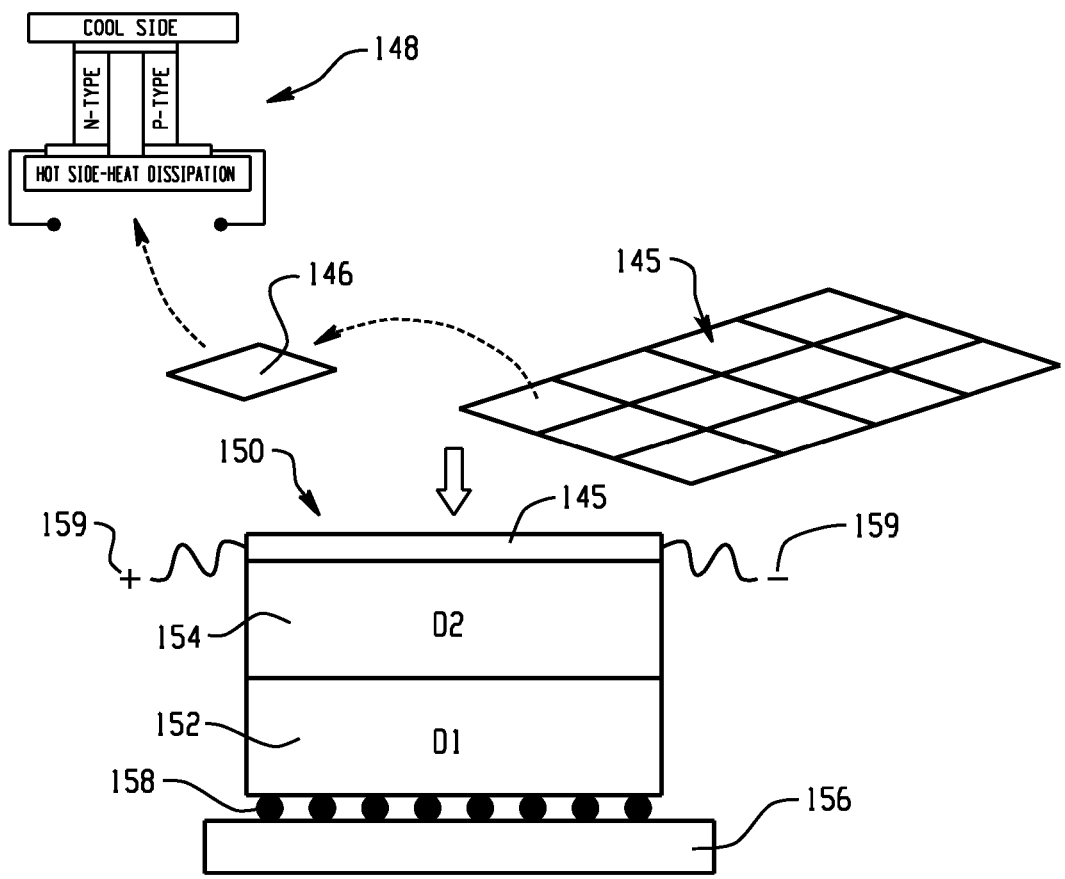

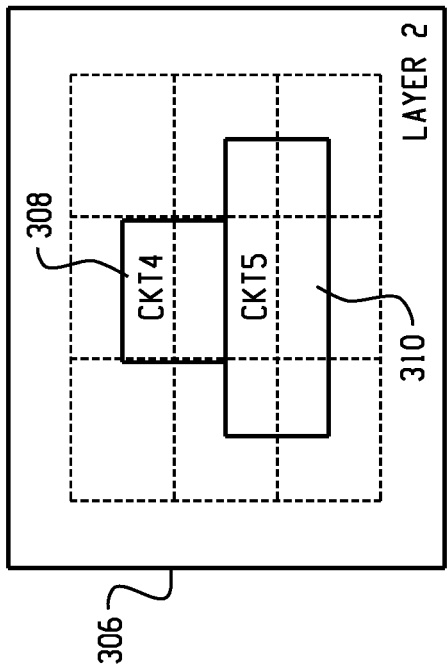
Fig. 3A
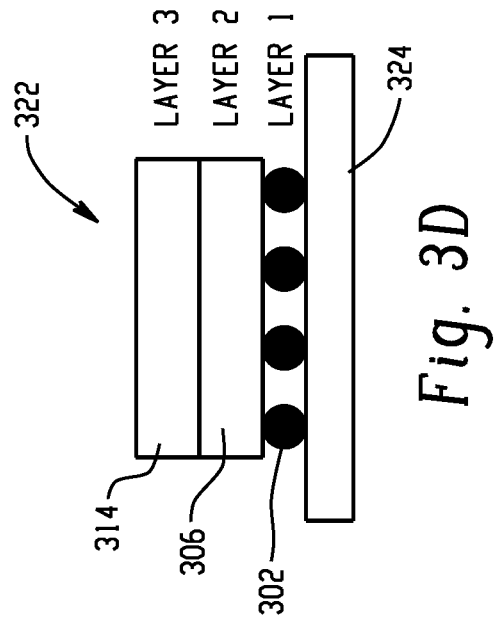
Fig. 3B
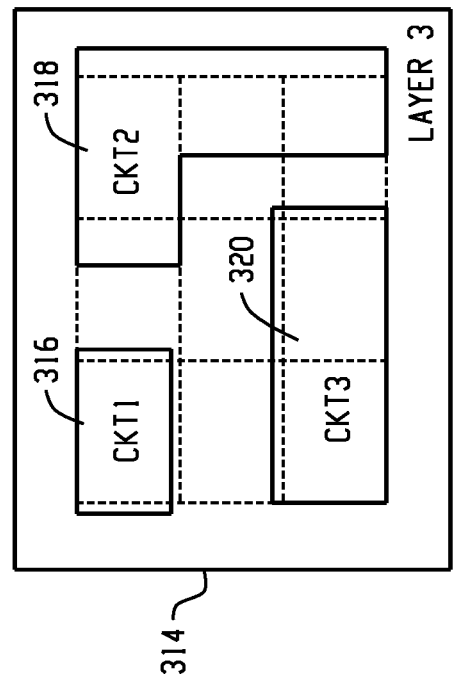
Fig. 3C
Fig. 3D

US 10,910,365 B2

STRUCTURE AND METHOD FOR COOLING THREE-DIMENSIONAL INTEGRATED CIRCUITS

PRIORITY CLAIM AND CROSS-REFERENCE

This application is a divisional of U.S. patent application Ser. No. 15/688,050, filed on Aug. 28, 2017, entitled "Structure and Method for Cooling Three-Dimensional Integrated Circuits," which application is a divisional of U.S. patent application Ser. No. 14/014,532, filed on Aug. 30, 2013, entitled "Structure and Method for Cooling Three-Dimensional Integrated Circuits," now U.S. Pat. No. 9,748,228 issued on Aug. 29, 2017, which applications are hereby incorporated herein by reference.

TECHNICAL FIELD

The technology described in this disclosure relates generally to a three-dimensional integrated circuit and more particularly to structures and methods for cooling three-dimensional integrated circuits.

BACKGROUND

A three-dimensional integrated circuit (3DIC) is a structure in which two or more layers of active electronic components may be integrated both vertically and horizontally in a single chip. Three-dimensional circuit architectures may enable, for example, the integration of logic devices, memory units, RF devices, optoelectronic devices, and microelectromechanical systems (MEMS) on a single chip. In a 3DIC, a plurality of device layers may be formed over a substrate, where each of the layers includes one or more semiconductor devices (e.g., one or more transistors). The device layers may be vertically separated from each other by interlayer dielectric layers or other interlayer layers.

SUMMARY

The present disclosure is directed to a structure and a method for cooling a three-dimensional integrated circuit (3DIC). A structure for cooling a 3DIC includes a cooling element configured for thermal connection to the 3DIC. The cooling element includes a plurality of individually controllable cooling modules disposed at a first plurality of locations relative to the 3DIC. Each of the cooling modules includes a cold pole and a heat sink. The cold pole is configured to absorb heat from the 3DIC. The heat sink is configured to dissipate the heat absorbed by the cold pole and is coupled to the cold pole via an N-type semiconductor element and via a P-type semiconductor element. The structure further includes a temperature sensing element including a plurality of thermal monitoring elements disposed at a second plurality of locations relative to the 3DIC for measuring temperatures at the second plurality of locations. The measured temperatures control the plurality of cooling modules.

In another example, a structure for cooling a 3DIC includes a cooling module configured for thermal connection to the 3DIC. The 3DIC includes a first device layer and a second device layer stacked vertically over a substrate, where the first and the second device layers are separated by an interface. The cooling module includes a first metal structure configured to absorb heat from the 3DIC, where the first metal structure includes a portion that is located at the interface. The cooling module also includes a second metal structure configured to dissipate the heat absorbed by the first metal structure. The second metal structure is coupled to the first metal structure via an N-type semiconductor element and via a P-type semiconductor element. The second metal structure includes portions that are disposed over the second device layer and disposed beneath the first device layer. The cooling module further includes the N-type semiconductor element and the P-type semiconductor element that are stacked vertically. The N-type semiconductor element and the P-type semiconductor element are separated vertically by the first metal structure. A thermal monitoring element is configured to measure a temperature of the 3DIC, and the measured temperature controls the cooling module.

In another example, in a method for cooling a 3DIC, temperatures are measured at a plurality of locations in the 3DIC. A location of a heat spot is determined within the 3DIC based on the measured temperatures. Cooling activities are executed near the location of the heat spot, where the cooling activities are executed by a cooling element that includes a plurality of individually controllable cooling modules. Certain of the individually controllable cooling modules near the location of the heat spot are turned on.

BRIEF DESCRIPTION OF THE DRAWINGS

FIGS. 1A, 1B, and 1C depict example structures for cooling a three-dimensional integrated circuit (3DIC).

FIGS. 3A, 3B, 3C, and 3D depict aspects of a 3DIC.

FIG. 8B depicts a graph illustrating an increase in thermal absorption of a cooling element as additional individually controllable cooling modules of the cooling element are turned on.

DETAILED DESCRIPTION

Figure 1D:
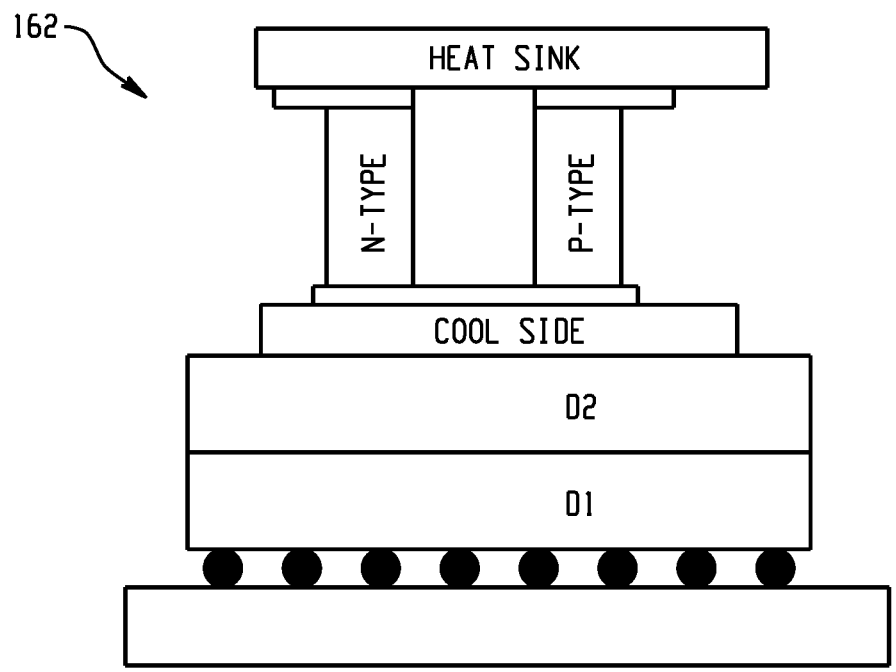
FIG. 1D depicts an individually controllable cooling module disposed substantially over a top device layer of a 3DIC.

FIGS. 1A, 1B, and 1C depicts example structures for cooling a three-dimensional integrated circuit (3DIC) 150. As depicted in FIG. 1C, the 3DIC 150 may include a device layer D1 152 and a device layer D2 154 that are stacked vertically over a substrate 156. Each of the device layers 152, 154 may include one or more semiconductor devices (e.g., one or more transistors) fabricated therein. The device layers 152, 154 of the 3DIC may be separated in the vertical direction by an interlayer dielectric layer and may be coupled to the substrate 156 using chip bumps 158 (e.g., solder bumps), for example.

FIG. 1A depicts a single, individually controllable cooling module that may be used in cooling the 3DIC 150. The individually controllable cooling module of FIG. 1A may include a cold pole 102 (e.g., a cool side) that is configured to absorb heat from the 3DIC 150. The cooling module may further include a heat sink 104 (e.g., a heat dissipation side) that is configured to dissipate the heat absorbed by the cold pole 102. The cold pole 102 and the heat sink 104 may include, for example, metal materials or other materials configured to absorb and dissipate heat, respectively. The heat sink 104 may be coupled to the cold pole 102 via an N-type semiconductor element 106 and via a P-type semiconductor element 108.

The N-type and P-type semiconductor elements 106, 108 may be, for example, doped silicon structures or other pieces of semiconductor material doped to achieve the N- and P-type conductivity of the elements 106, 108. In other examples, the N-type element 106 or the P-type semiconductor element 108 may comprise a superlattice structure. The superlattice structure may be a periodic structure of layers of two or more materials. For example, the N-type semiconductor element 106 may include the superlattice structure, where the two or more materials include InAs, GaSb, $Al_xGa_{1-x}Sb$, or $Al_yGa_{1-y}As$. As another example, the P-type semiconductor element 108 may include the superlattice structure, where the two or more materials include AlGaN, GaN, or SiGe. The N-type semiconductor element 106 and the P-type semiconductor element 108 may be connected to the cold pole 102 and the heat sink 104 via conductive materials (e.g., metal conductors).

The N-type and P-type semiconductor elements 106, 108 may together form a P-N thermocouple. Extra electrons in the N-type semiconductor element 106 and extra holes in the P-type semiconductor element 108 may function as carriers, where the carriers are agents that may absorb heat energy from the 3DIC 150 and move the absorbed heat from the cold pole 102 to the heat sink 104. A DC power source connected to the structure via connections 110 (e.g., electrical contacts) may pump electrons from the N-type semiconductor element 106 to the P-type semiconductor element 108. The DC power source connected to the structure via the connections 110 may be used to effectively turn the cooling module on and off by applying a variable current or voltage to the module, for example. Because the cooling module of FIG. 1A can be dynamically turned on and off via the application of the current or voltage, the cooling module may be termed an active absorber unit. The active absorber unit may be contrasted with passive thermal absorption materials that may not be turned on and off.

FIG. 1B depicts a plurality of individually controllable cooling modules 135. The plurality of cooling modules 135 may include a single cold pole 132 and a single heat sink 134, as depicted in FIG. 1B. The cold pole 132 and the heat sink 134 may be coupled together via a plurality of N-type semiconductor elements 136 and via a plurality of P-type semiconductor elements 138. Although the example of FIG. 1B depicts the single cold pole 132 and the single heat sink 134 (e.g., formed as planar layers 132, 134 that extend across the plurality of N-type semiconductor elements 136 and the plurality of P-type semiconductor elements 138), in other examples, a plurality of cold poles and a plurality of heat sinks may be used in forming the plurality of individually controllable cooling modules 135.

A DC power source connected to the plurality of individually controllable cooling modules 135 via the connections 140 may be used to control (e.g., turn off and turn on) one or more of the individually controllable cooling modules. In one example, the plurality of individually controllable cooling modules 135 may implement a hybrid control technology, whereby the cooling modules 135 may be controlled both on an individual basis and as a group (e.g., allowing all of the cooling modules to be turned off or turned on simultaneously).

FIG. 1C depicts an array 145 of individually controllable cooling modules. In the example of FIG. 1C, the array 145 may include a plurality of units 146, where each of the units 146 may include a single, individually controllable cooling module 148. The individually controllable cooling module 148 may be the same or similar to the cooling module described with reference to FIG. 1A, for example. The array 145 of cooling modules may be placed over a top device layer (i.e., the device layer D2 154) of the 3DIC 150. The array 145 of cooling modules may be placed over the top device layer such that a cold pole (e.g., the cold pole 102 of the cooling module depicted in FIG. 1A) is coupled to a surface of the top device layer and is able to absorb heat from the 3DIC 150. FIG. 1C also depicts connections 159 (e.g., electrical contacts) coupled to the array 145 that may be used to connect a power source, a voltage source, or a current source to the cooling modules 148 making up the array 145. Using the connections 159, the cooling modules may be turned on and off both as a group and on an individual basis.

Use of conventional cooling techniques may be inadequate to cool the 3DIC 150. Such three-dimensional circuits may pose thermal management challenges to the conventional cooling techniques because the 3DIC 150 may include a dense integration of circuits and devices and may have a relatively small cooling surface. The cooling modules described with reference to FIGS. 1A, 1B, and 1C may have a relatively high thermal conduction capability (e.g., within a range of approximately 200-400 $W/cm^2$) that may aid in cooling the 3DIC 150.

As explained in greater detail below, the cooling modules of FIGS. 1A, 1B, and 1C may be combined with a temperature sensing structure including a plurality of thermal monitoring elements. The thermal monitoring elements may measure the temperature at different locations within the 3DIC 150. The measured temperatures may be used to control the cooling modules of FIGS. 1A, 1B, and 1C in order to provide a precise cooling reaction at a particular area of the 3DIC. For example, local heat spots in the 3DIC 150 may be cooled by turning on certain of the cooling elements 148 of the array 145 of FIG. 1C, while leaving other of the cooling elements 148 turned off. Further, the active cooling modules described with reference to FIGS. 1A, 1B, and 1C may be used in combination with traditional cooling methods (e.g., passive absorption materials) to enable a hybrid cooling solution that can be tailored to particular characteristics of the 3DIC 150 to be cooled.

FIG. 1D depicts an individually controllable cooling module 162 disposed substantially over a top device layer of a 3DIC. In the example of FIG. 1D, a cold pole of the cooling module 162 may be coupled to a surface of the top device layer and may absorb heat from the 3DIC. An N-type semiconductor element and a P-type semiconductor element may be located within a single vertical layer that is located substantially over the cold pole. A heat sink may be disposed substantially over the single vertical layer that includes the N- and P-type semiconductor elements and may be configured to dissipate the heat absorbed by the cold pole into a surrounding environment (e.g., the air).

Figure 1E:
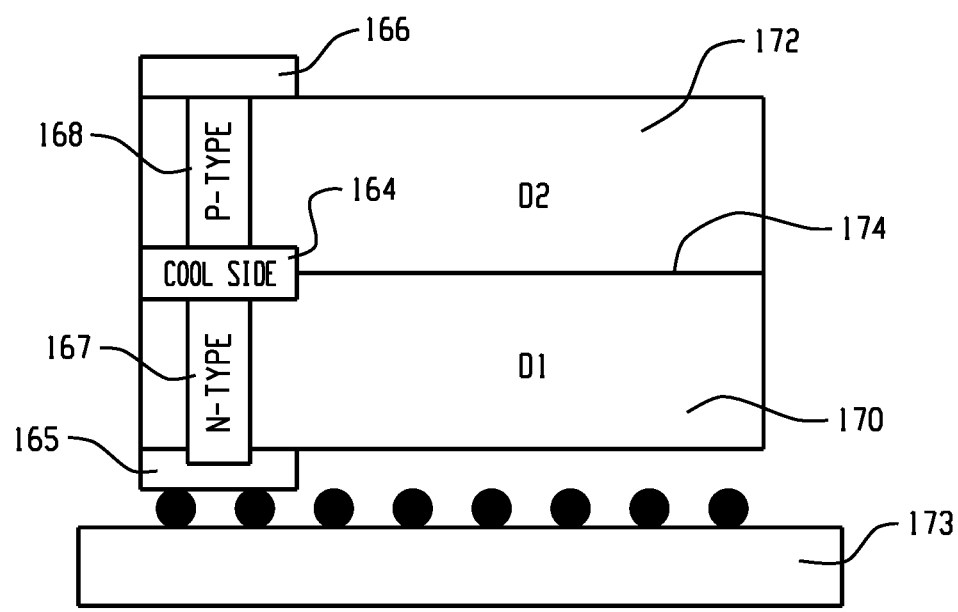
FIG. 1E depicts an individually controllable cooling module that utilizes a vertical arrangement of elements.

FIG. 1E depicts an individually controllable cooling module that utilizes a vertical arrangement of elements. A 3DIC may include a plurality of device layers (e.g., a device layer D1 170 and a device layer D2 172) that are stacked vertically over a substrate 173. Each of the device layers 170, 172 may include one or more semiconductor devices (e.g., one or more transistors) and may be separated from other device layers 170, 172 by an interface 174 (e.g., an interface including an interlayer dielectric layer).

In the vertical arrangement for the cooling module depicted in FIG. 1E, the cooling module may include portions that are integrated (i.e., embedded) within the device layers 170, 172. Specifically, a cold pole 164 may be located at the interface 174 (e.g., embedded within the 3DIC between the device layers 170, 172). A heat sink may include a portion 166 that is located over the device layer D2 172 and a portion 165 that is located beneath the device layer D1 170. An N-type semiconductor element 167 and a P-type semiconductor element 168 may be divided into two separate layers that are stacked vertically. Specifically, the N-type semiconductor element 167 and the P-type semiconductor element 168 may be integrated into the device layer D1 170 and the device layer D2 172, respectively, and separated vertically by the cold pole 164.

In the vertical arrangement of FIG. 1E, the portions 165, 166 of the heat sink beneath the bottom device layer 170 and over the top device layer 172 may be connected electrically, thus forming a closed loop in the vertical direction. The vertical arrangement of FIG. 1E may reduce an amount of area occupied by a cooling apparatus (e.g., the vertical arrangement of FIG. 1E may occupy less area as compared to the horizontal arrangement depicted in FIG. 1D). Although the example of FIG. 1E illustrates a single cooling element in the vertical arrangement, in other examples, a plurality of vertically arranged cooling elements may be used. Because the vertical arrangement may include portions (e.g., the cold pole 164 and the N- and P-type semiconductor elements 167, 168) that are integrated within the layers 170, 172 of the 3DIC, the plurality of vertically arranged cooling elements may be arranged throughout an entirety of an x-y plane of the 3DIC, where the layers 170, 172 are stacked vertically in the z-direction (e.g., the vertically arranged cooling elements of FIG. 1E can be fabricated within an interior region of the 3DIC, and not just at outer edges of the 3DIC).

Figure 1F:
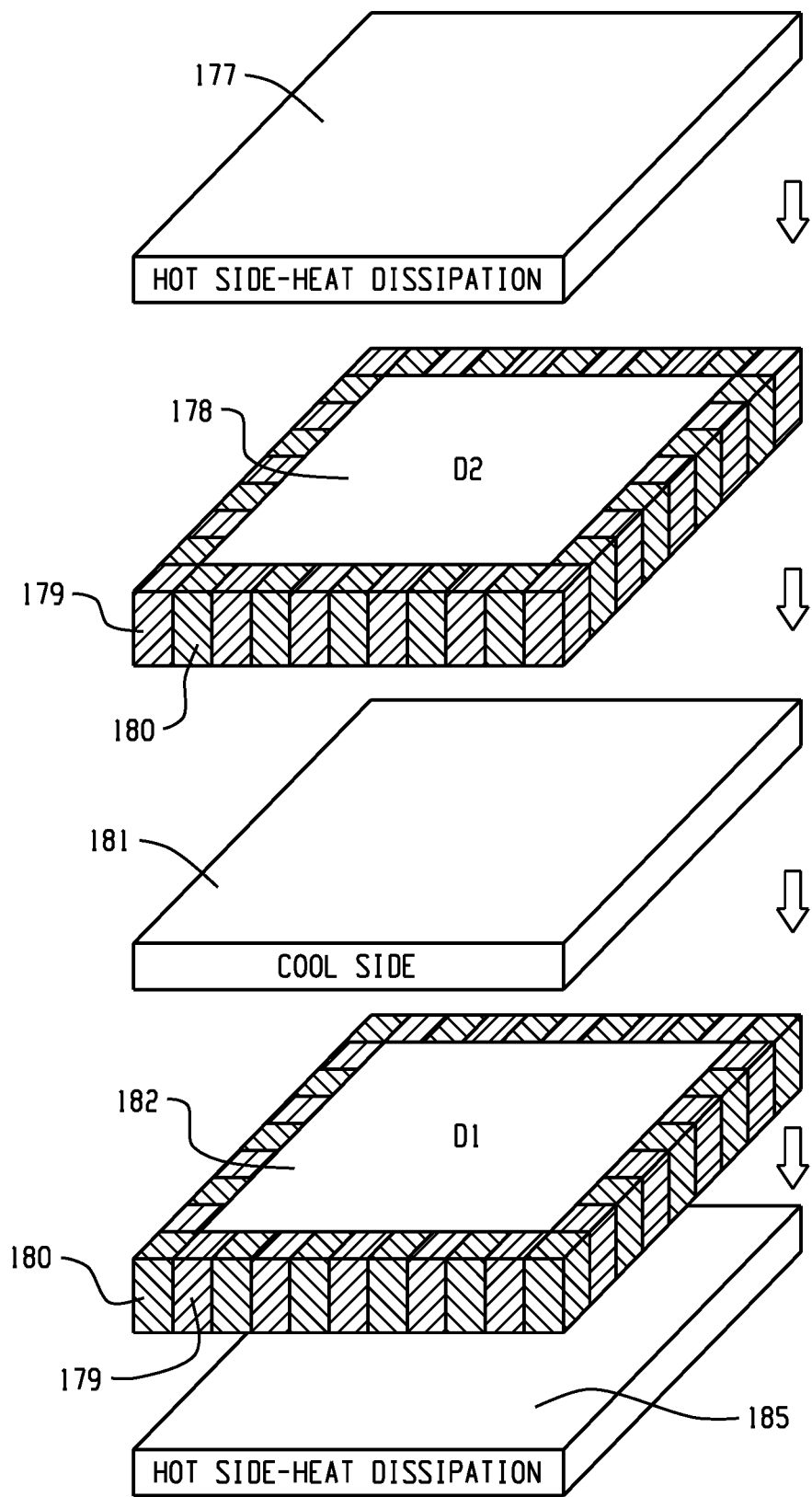
FIG. 1F depicts a plurality of individually controllable cooling modules arranged at an outer edge of a 3DIC.

FIG. 1F depicts a plurality of individually controllable cooling modules arranged at an outer edge of a 3DIC. In FIG. 1F, each of the individually controllable cooling modules may utilize a vertical arrangement (e.g., a vertical arrangement similar to that depicted in FIG. 1E), where an N-type semiconductor element 179 and a P-type semiconductor element 180 may be divided into two separate layers that are stacked vertically. The N-type semiconductor element 179 and the P-type semiconductor element 180 may be disposed along the outer edge of the 3DIC (e.g., around sidewalls of the 3DIC) and may be separated vertically by a cold pole 181.

Specifically, in FIG. 1F, a first set of semiconductor elements including a plurality of N-type semiconductor elements 179 and a plurality of P-type semiconductor elements 180 may be arranged around an outer edge of a first device layer D1 182 of the 3DIC. A second set of semiconductor elements including a plurality of N-type semiconductor elements 179 and a plurality of P-type semiconductor elements 180 may be arranged around an outer edge of a second device layer D2 178 of the 3DIC. The cold pole 181 may be located at an interface between the first device layer D1 182 and the second device layer D2 178.

Additionally, in FIG. 1F, a heat sink layer 177 may be disposed substantially over the second device layer D2 178, and a heat sink layer 185 may be disposed substantially under the first device layer D1 185. When the cold pole 181, the device layers 178, 182, and the heat sink layers 177, 185 are brought together in this arrangement, the N-type and the P-type semiconductor elements 179, 180 may couple the cold pole 181 to the heat sink layers 177, 185, thus forming a plurality of cooling modules of the vertical arrangement depicted in FIG. 1E (i.e., N-type and P-type semiconductor elements 179, 180 are stacked vertically, separated by the cold pole 181). The arrangement of FIG. 1F may be modified in various ways. For example, although the arrangement of FIG. 1F depicts cooling modules disposed at an outer edge of the 3DIC, in other examples, cooling modules including a vertical arrangement of elements (e.g., the vertical arrangement depicted in FIG. 1E) may also be integrated within interior regions of the 3DIC (e.g., not only at the outer edges of the 3DIC, as depicted in FIG. 1F).

Figure 2:
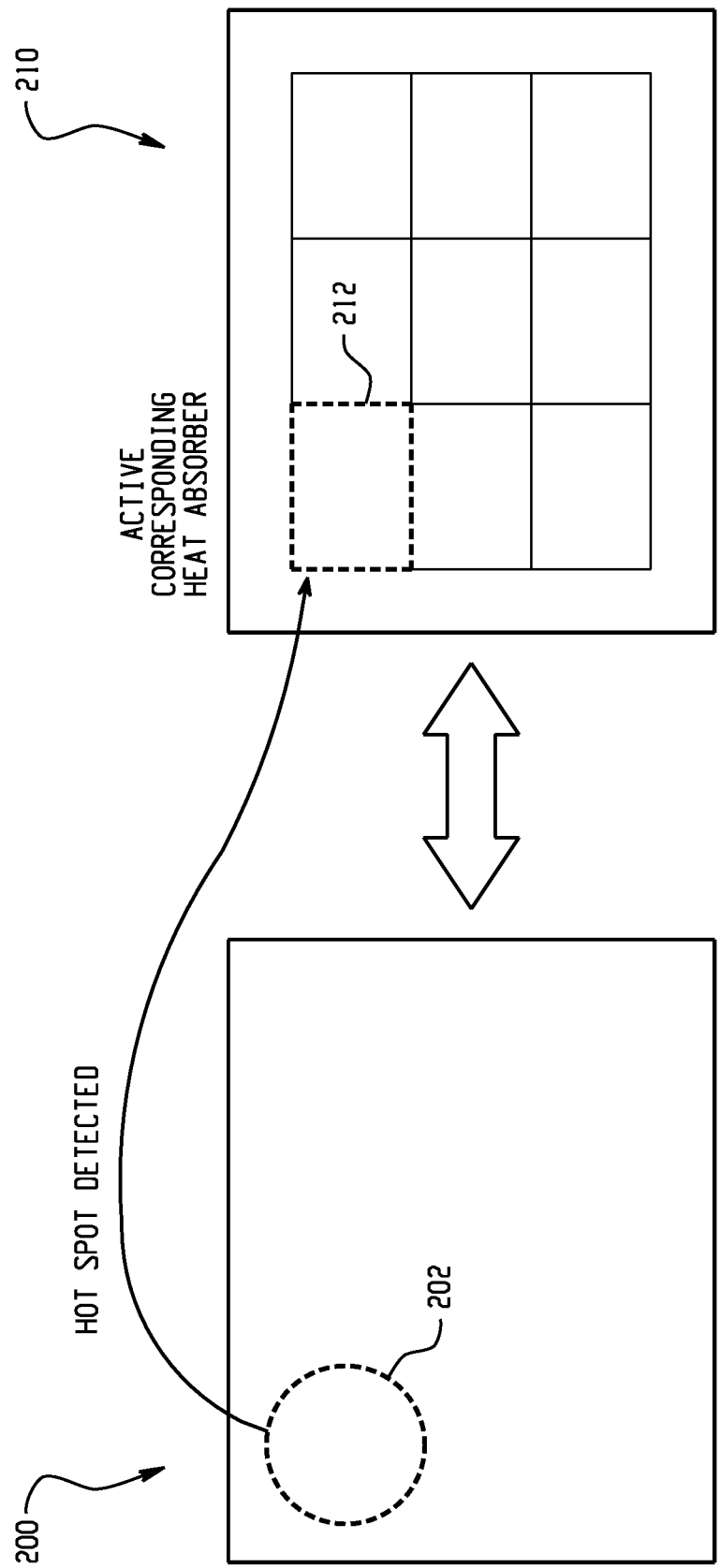
FIG. 2 depicts an array of active heat absorbing units used to provide local cooling at a hot spot within a 3DIC.

FIG. 2 depicts an array 210 of active heat absorbing units used to provide local cooling at a hot spot 202 within a three-dimensional integrated circuit (3DIC). At 200, the hot spot 202 may be detected in the 3DIC. The hot spot 202 may be a localized area within the 3DIC that has been determined to have a temperature that is too high. The hot spot 202 may be detected by a temperature sensing structure that includes a plurality of thermal monitoring units disposed at a plurality of locations within the 3DIC. The temperature sensing structure may be integrated within the 3DIC itself, or alternatively, the temperature sensing structure may be physically separate from the 3DIC but nonetheless able to measure temperatures at the plurality of locations within the 3DIC.

A single active heat absorbing unit 212 (e.g., an individually controllable cooling element) of the array 210 may be turned on to provide the local cooling at the hot spot 202. The single active heat absorbing unit 212 may be located near the hot spot 202 to be cooled, such that only the unit 212 is turned on, and other units of the array 210 are not turned on. When the particular area has been sufficiently cooled, the single active heat absorbing unit 212 may be turned off. The array 210 of heat absorbing units may include cooling modules constructed in a vertical arrangement (e.g., as depicted in FIG. 1E) or in a horizontal arrangement (e.g., as depicted in FIG. 1D).

The single active heat absorbing unit 212 may be turned on and off based on temperatures measured by the plurality of thermal monitoring units. For example, the temperature sensing structure may generate a first signal based on the temperatures measured by the plurality of thermal monitoring units. The first signal may indicate, for example, that a high temperature has been detected at the hot spot 202, or that the hot spot 202 has sufficiently cooled in response to a cooling procedure. A controller or decoder coupled to the temperature sensing structure may receive the first signal and generate one or more second signals that are used turn off and on heat absorbers of the array 210. The combination of the array 210 of active heat absorbing units and the temperature sensing structure may allow for dynamic cooling of the 3DIC, whereby individual units of the array 210 are turned on and off as needed, in response to measured temperatures of the 3DIC.

FIGS. 3A, 3B, 3C, and 3D depict aspects of a three-dimensional integrated circuit (3DIC) 322. The 3DIC 322 is a structure in which two or more device layers 306, 314 of active electronic components may be integrated both vertically and horizontally in a single chip. In the 3DIC 322, the plurality of device layers 306, 314 may be formed over a substrate 324, where each of the device layers 306, 314 includes one or more semiconductor devices (e.g., one or more transistors). Each of the device layers 306, 314 may comprise a semiconductor die.

The one or more semiconductor devices included in the device layers 306, 314 may be located in circuit blocks 308, 310, 316, 318, 320 that are included within the device layers 306, 314. For example, in the example of FIG. 3B, the device layer 306 (i.e., the layer 2) includes a "circuit 4" circuit block 308 and a "circuit 5" circuit block 310. The device layer 314 (i.e., the layer 3) includes a "circuit 1" circuit block 316, a "circuit 2" circuit block 318, and a "circuit 3" circuit block 320. The circuit blocks 308, 310, 316, 318, 320 are arranged to be located at various locations within the x-y plane of each layer 306, 314, and each of the circuit blocks 308, 310, 316, 318, 320 may include one or more semiconductor devices (e.g., one or more transistors).

The device layers 306, 314 may be separated vertically from each other by interlayer dielectric layers or other interlayer layers, and the device layers 306, 314 may be formed substantially over a first layer 302 that includes a plurality of chip bumps 304 (e.g., solder bumps). A hot spot in the 3DIC 322 may be detected by a temperature sensing structure that includes a plurality of thermal monitoring units disposed at a plurality of locations within the 3DIC. In one example, the plurality of locations for the thermal monitoring units may correspond to the locations of the circuit blocks 308, 310, 316, 318, 320 comprising the 3DIC 322. Thus, for example, each of the circuit blocks 308, 310, 316, 318, 320 may include one or more thermal monitoring units integrated within the circuit block, such that the one or more thermal monitoring units can sense a temperature within the circuit block and detect if a hot spot has formed in the circuit block.

Figure 4B:
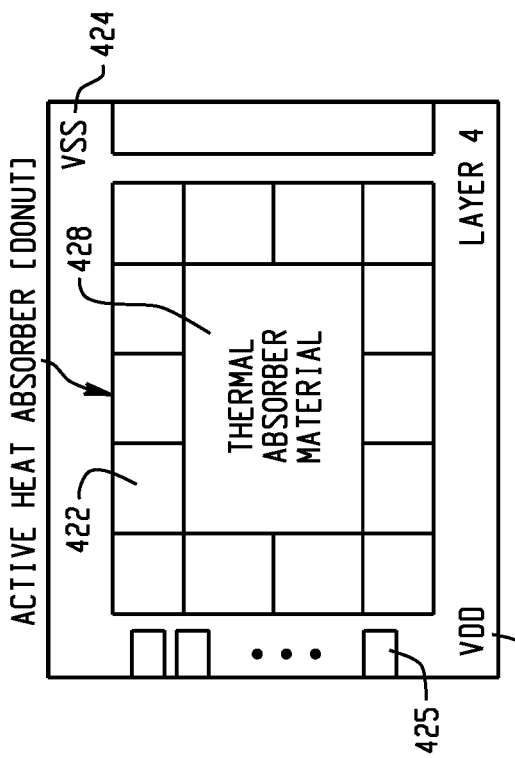
FIGS. 4A and 4B depict arrangements of individually controllable cooling modules that may be used to cool a 3DIC.
Figure 4D:
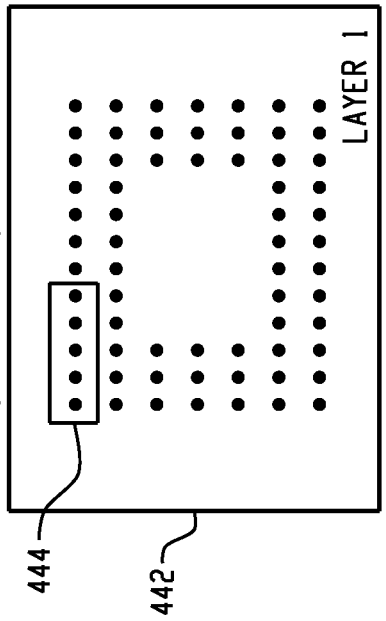
FIG. 4D depicts a first layer of a 3DIC that includes a plurality of solder bumps.
Figure 4A:
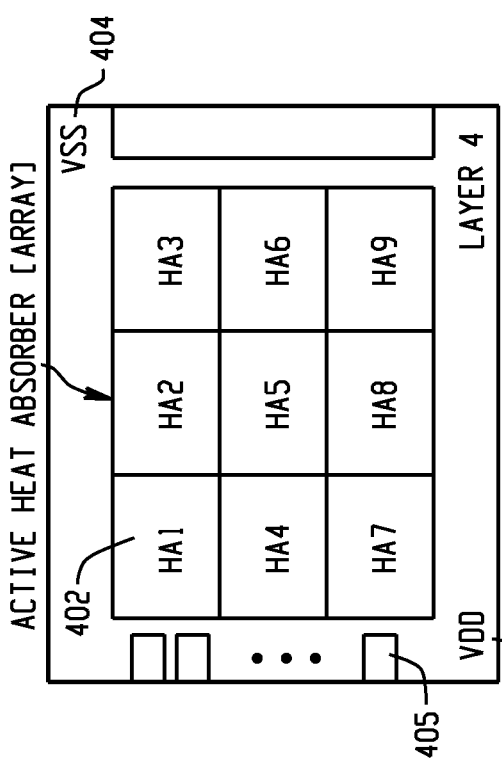
Figure 4C:
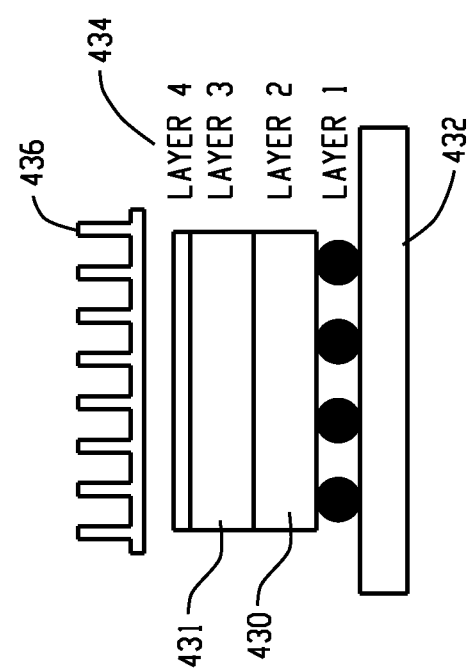
FIG. 4C depicts a 3DIC with a layer including a cooling element provided over a top device layer of the 3DIC.

FIGS. 4A and 4B depict arrangements of individually controllable cooling modules 402, 422 that may be used to cool a three-dimensional integrated circuit (3DIC). The arrangements of cooling modules 402, 422 depicted in FIGS. 4A and 4B may be fabricated in a layer 434 that is provided over a top device layer of the 3DIC, as illustrated in FIG. 4C. In other examples, the cooling modules 402, 422 are not located in the layer 434 that is over the top device layer, and instead, the cooling modules 402, 422 may be integrated within layers 430, 431 of the 3DIC. When integrated within the layers 430, 431, the cooling modules 402, 422 may be constructed in a vertical arrangement (e.g., the vertical arrangement depicted in FIG. 1E). In FIG. 4C, the 3DIC includes the device layers 430, 431 formed over a substrate 432, and an external heat sink 436 may be used to speed dissipation of heat absorbed within the layer 434.

In FIG. 4A, the arrangement of cooling modules 402 may implement an array of active heat absorbers. The array of FIG. 4A may include the plurality of cooling modules 402 provided at a plurality of locations that are contiguous locations covering substantially an entirety of the surface of the top device layer 431. As depicted in FIG. 4A, portions of the surface not covered by the cooling modules 402 may implement electrical connection areas (e.g., contacts, wire bonding sites) for providing reference voltages, currents, or other signals to the cooling modules 402. For example, in FIG. 4A, the layer includes areas for supplying a high reference voltage VDD 406 and for supplying a low reference voltage (e.g., ground) VSS 404 to the cooling element. The layer of FIG. 4A may also include pins 405, where the pins 405 may be used to supply various voltages, currents, or signals to the array of cooling modules 402. The pins 405 may be used to supply control signals to the array, where the control signals may be used, for example, to cause one or more of the cooling modules 402 to be turned on or turned off.

In FIG. 4B, the arrangement of cooling modules 422 may implement a "donut" arrangement of active heat absorbers. The donut arrangement of FIG. 4B may include the plurality of cooling modules 422 provided at a plurality of locations that are near an outer edge of the top device layer 431. As depicted in FIG. 4B, a thermal absorber material 428 may be provided inside the box of active heat absorbers 422 formed around the outer edge. The thermal absorber material 428 may comprise, for example, a passive thermal absorption material that may not be turned on and off (e.g., in contrast to the active cooling modules 402, 422 that can be turned on and off via an application of a voltage or current).

In FIG. 4B, additional portions of the surface not covered by the cooling modules 422 may implement electrical connection areas for providing reference voltages, currents, or other signals to the array of cooling modules 422. In FIG. 4B, the layer may include areas for supplying a high reference voltage VDD 426 and for supplying a low reference voltage (e.g., ground) VSS 424 to the cooling element. The layer of FIG. 4B may also include pins 425, where the pins 425 may be used to supply various voltages, currents, or signals to the array of cooling modules 422.

FIG. 4D depicts a first layer 442 of the 3DIC that includes a plurality of chip bumps (e.g., solder bumps). In the example of FIG. 4D, five chip bumps 444 may receive signals indicating that one or more circuit blocks included in the 3DIC require cooling. For example, with reference to FIGS. 3B and 3C, the 3DIC may include, for example, five discrete circuit blocks 308, 310, 316, 318, 320 within the device layers 306, 314 of the 3DIC. Each of the five discrete circuit blocks 308, 310, 316, 318, 320 may include one or more thermal monitoring elements used to measure the temperature within the various circuit blocks 308, 310, 316, 318, 320. When the thermal monitoring elements or a decoder coupled to the thermal monitoring elements determine that one or more of the circuit blocks require cooling, a signal provided to the chip bumps 444 may be used to initiate a cooling process.

Each of the five chip bumps 444 may correspond to a particular one of the circuit blocks 308, 310, 316, 318, 320, and may be used to receive a signal indicating that the particular one of the circuit blocks requires cooling. For example, a first of the five chip bumps 444 may correspond to the "first circuit" circuit block 316 in FIG. 3C. A signal received at the first of the five chip bumps 444 may indicate that a hot spot has developed in the circuit block 316. A controller or decoder may provide the signal on the first of the five chip bumps 444, and the signal may be used to turn on certain of the cooling modules 402, 422, as needed. For example, in the example of FIG. 4A, a cooling module 402 labeled "HA1" may be turned on to cool the circuit block 316 because the HA1 cooling module is located at an area of the layer that is closest to the circuit block 316. In other examples, multiple of the cooling modules 402, 422 may be turned on or off based on signals on the five chip bumps 444.

Figure 5:
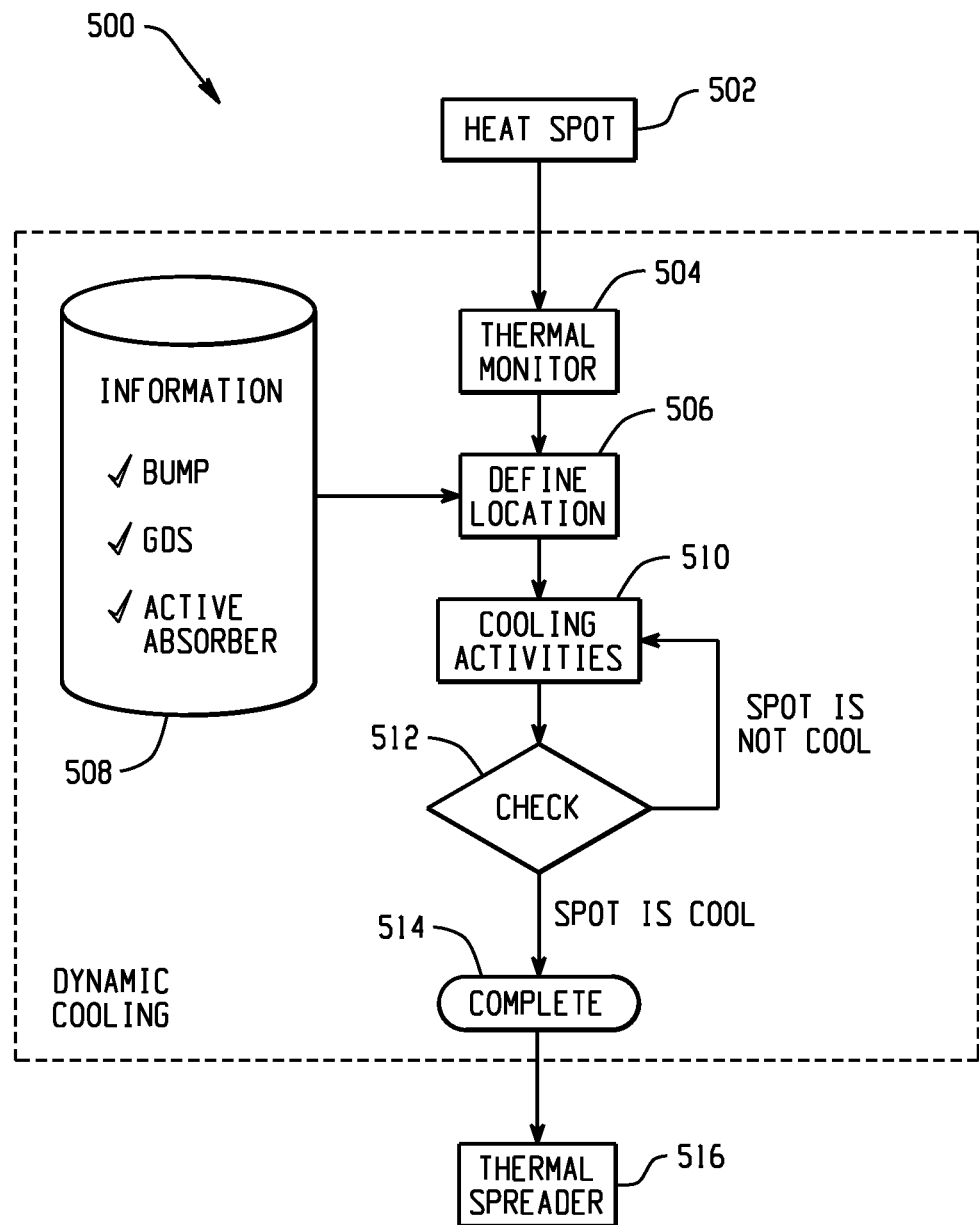
FIG. 5 depicts a flowchart depicting information used in cooling a 3DIC.

FIG. 5 depicts a flowchart 500 depicting information used in cooling a three-dimensional integrated circuit (3DIC). As described above, with reference to FIGS. 1C and 2, a structure for cooling the 3DIC may include a temperature sensing structure that includes a plurality of thermal monitoring elements located throughout the 3DIC. The thermal monitoring elements may record temperatures at the locations throughout the 3DIC, and the measured temperatures may control a plurality of cooling modules (e.g., by turning on and off individually controllable cooling modules based on the measured temperatures). Specifically, when a high temperature is detected at a particular location in the 3DIC, only certain of the plurality of cooling modules may be turned on (e.g., cooling modules that are near the particular location) to cool the particular location, and other cooling modules may remain turned off. Turning on only certain of the cooling modules may save power and allow for targeted cooling within the 3DIC.

As depicted in FIG. 5, at 502, a heat spot may be detected by a thermal monitoring element 504. In order to turn on cooling modules that are located near the heat spot, at 506, a location of the heat spot may be determined. Information 508 used to determine the location of the heat spot may be stored in a memory and may include i) information on chip bumps, ii) a Graphic Data System (GDS) layout of the circuit elements comprising the 3DIC, where the GDS layout specifies locations of circuit elements within the plurality of device layers of the 3DIC, and iii) information on the locations of the plurality of cooling modules. The chip bumps may include a plurality of chip bumps formed over a substrate (e.g., the chip bumps 444 illustrated in FIGS. 4C and 4D), where each of the chip bumps may correspond to a particular one of the circuit elements. Each of the chip bumps may be configured to receive a current, voltage, or a signal that is indicative of a temperature at the particular one of the circuit elements (e.g., a signal from a decoder indicating that the particular one of the circuit elements has developed a heat spot).

Based on the information 508 used to define the location of the heat spot, at 510, certain of the plurality of cooling modules may be turned on (e.g., cooling modules that are near the particular location) to perform cooling activities near the heat spot. At 512, a check may be performed to determine whether the location of the heat spot continues to require cooling. If the heat spot is not cool, the cooling activities at 510 may continue. If the heat spot is cool, at 514, it may be determined that the cooling activities are complete. At 516, a thermal spreader may dissipate heat absorbed during the cooling activities.

Figure 6:
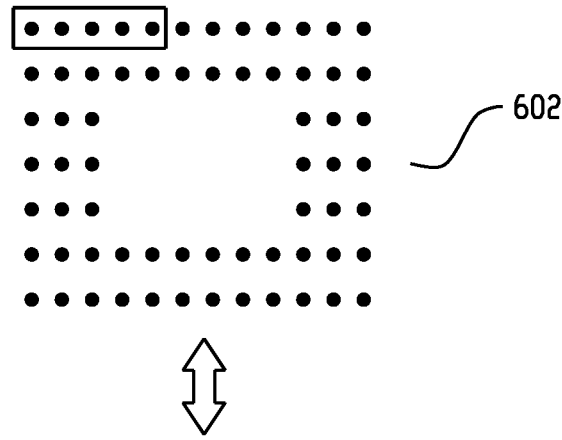
FIG. 6 illustrates aspects of determining a location of a heat spot within a 3DIC.
Figure 6:
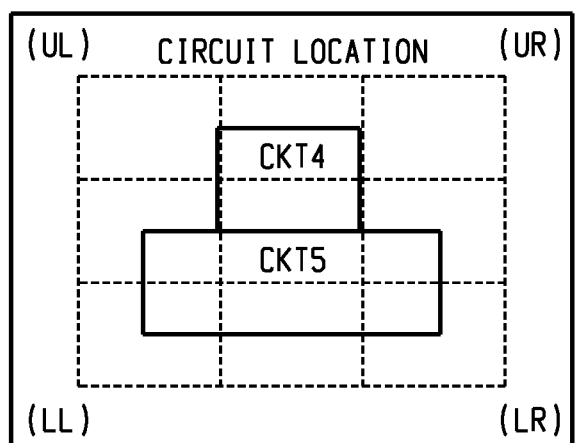
Figure 6:
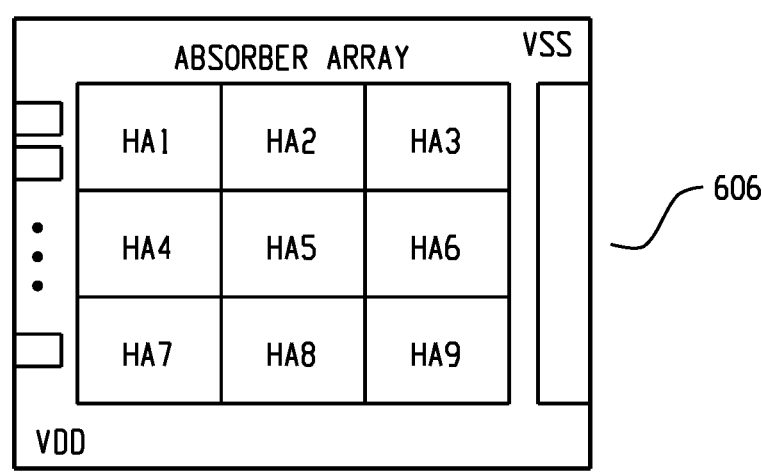

FIG. 6 illustrates aspects of determining a location of a heat spot within a three-dimensional integrated circuit (3DIC). As described above with reference to FIG. 5, a variety of information may be stored in a memory on the 3DIC, where the information stored in the memory may be used in defining the location of the heat spot, such that cooling modules near the heat spot may be turned on and off as needed. One or more thermal monitoring elements may be placed within each of a plurality of circuit elements that comprise the 3DIC, and the one or more thermal monitoring elements may monitor a temperature within a particular circuit element.

At 602, a plurality of chip bumps (e.g., solder bumps) are depicted. The chip bumps at 602 may be formed over a substrate (e.g., as depicted in FIG. 4C), where certain of the chip bumps (e.g., the first five chip bumps, as highlighted in FIG. 6) may each correspond to a particular one of the circuit elements. The chip bumps that correspond to the circuit elements may each be configured to receive a current, voltage, or a signal that is indicative of a temperature (e.g., a heat spot) at the particular one of the circuit elements. The current, voltage, or signal may be received from the one or more thermal monitoring elements placed within the circuit elements and may be used to turn on one or more cooling modules. Alternatively, the current, voltage, or signal may be received from a decoder that is coupled to the one or more thermal monitoring elements, as described in greater detail below. Information on the plurality of chip bumps may be stored in the memory. For example, information on a chip bump's location and function may be stored in the memory (e.g., that a chip bump located in the topmost, outer left position may be configured to receive the current, voltage, or signal that is indicative of the temperature of a first circuit element). Information on the chip bump's connectivity may be also be stored in the memory.

At 604, a layout of circuit elements comprising the 3DIC is depicted. The layout may include locations of the circuit elements (e.g., locations of a fourth circuit element and a fifth circuit element, as depicted in FIG. 6). Information on the layout of circuit elements may be stored in the memory. For example, information on GDS layout boundaries (e.g., UL, UR, LL, LR elements that may specify x-y coordinates of the upper left, upper right, lower left, and lower right portions of the GDS layout, as depicted in FIG. 6) may be stored in the memory. Information on the stacking hierarchy of the 3DIC may also be stored in the memory. The information on the layout of circuit elements stored in memory may further include x-y coordinates of the circuit elements (e.g., coordinates of the fourth circuit element and the fifth circuit element, as depicted in FIG. 6).

At 606, an array of cooling modules (e.g., heat absorbers 1-9) is depicted. Information on the location of each individual cooling module within the array may be stored in the memory (e.g., x-y coordinates of each individual uni-cell). Further, although the array of cooling modules is depicted at 606, information on any other type of arrangement may be similarly stored in the memory. For example, if the cooling modules are arranged in a donut structure (e.g., as depicted in FIG. 4B), the x-y coordinates of each of the cooling modules making up the donut structure may be stored in memory.

Using the information on i) the chip bumps, ii) the layout of the circuit elements within the 3DIC, and iii) the locations of the cooling modules stored in memory, individual cooling modules may be configured to automatically turn on and off in response to temperatures measured in the 3DIC. As described above, using this information, only cooling modules that are near a heat spot may be turned on, thus saving power by allowing other cooling modules to remain off. Using the information on the chip bumps, the layout of circuit elements, and the locations of the cooling modules stored in the memory, the current, voltage, or signal provided to a particular chip bump may be traced to a particular circuit element within the 3DIC, and following that, the particular circuit element may be mapped to one or more of the individual cooling modules that are located near the particular circuit element. The one or more of the individual cooling modules may be controlled (e.g., turned on and off in an automatic, dynamic manner) based on the information on the temperature provided by the current, voltage, or signal on the chip bump.

Figure 7C:
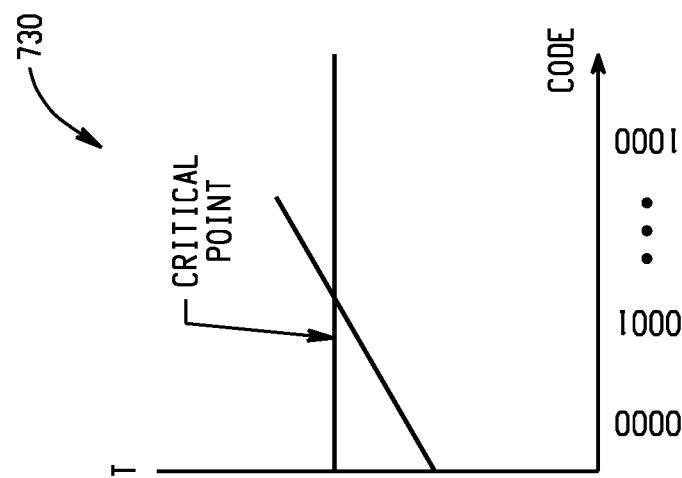
FIG. 7C depicts a graph that illustrates an example comparison between a temperature measured in a temperature insensitive reference device and a temperature measured within a circuit element of a 3DIC.
Figure 7B:
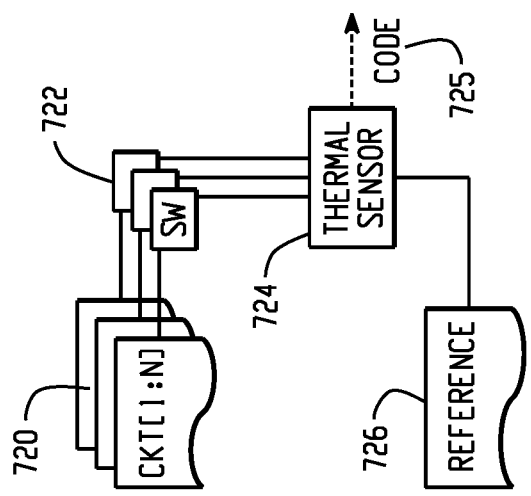
FIG. 7B illustrates an example use of a switch to compare a temperature measured in a single circuit element with a temperature measured at a temperature insensitive reference point.
Figure 7A:
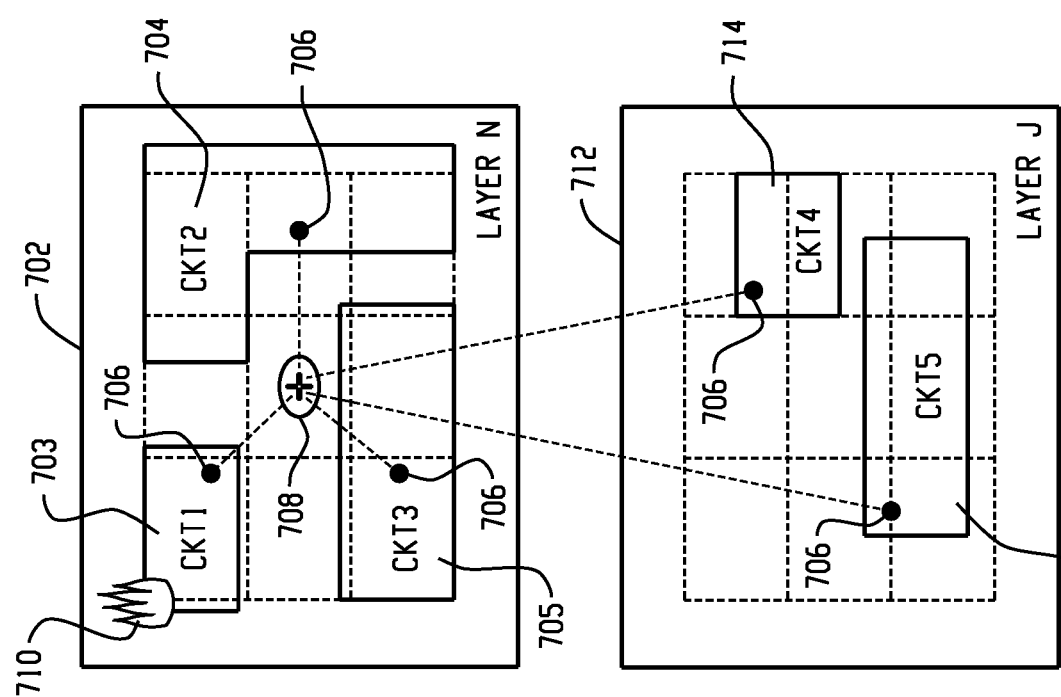
FIG. 7A depicts a device layer N and a device layer J of a 3DIC, where the device layers include a plurality of circuit elements.

FIG. 7A depicts a device layer N 702 and a device layer J 712 of a three-dimensional integrated circuit (3DIC), where the device layers 702, 712 include a plurality of circuit elements 703, 704, 705, 714, 716. As depicted in FIG. 7A, each of the circuit elements 703, 704, 705, 714, 716 may include a thermal monitoring element 706, and each of the thermal monitoring elements 706 may be coupled to a temperature insensitive reference point 708.

A thermal sensor may be configured to compare temperatures measured by the thermal monitoring elements 706 with a temperature measured at the temperature insensitive reference point 708. Based on the comparisons, a first signal may be generated, where the first signal is received by a digital decoder. The digital decoder may be coupled to thermal sensor and may be configured to generate one or more second signals that are used to turn off and turn on individual cooling modules.

For example, a temperature measured by the thermal monitoring element 706 in the circuit element 703 may be compared to a temperature measured at the temperature insensitive reference point 708. If a hot spot 710 has caused the temperature in the circuit element 703 to be elevated, the comparison may indicate that the temperature in the circuit element 703 has exceeded a critical point. The first signal generated based on the comparison may be received by the digital decoder, and the digital decoder may be used to output the second signal that is configured turn on an individual cooling element located near the circuit element 703.

FIG. 7B illustrates an example use of a switch 722 to compare a temperature measured in a single circuit element 720 with a temperature measured at a temperature insensitive reference point 726. As described above with reference to FIG. 7A, each of a plurality of circuit elements 720 included in a 3DIC may include a thermal monitoring element configured to measure the temperature in the circuit element 720. The temperatures measured by the thermal monitoring elements may be compared with the temperature measured at the temperature insensitive reference point 726. The switch 722 may be configured to couple a single circuit element 720 to a thermal sensor 724 at a time, such that the temperatures measured at the circuit elements 720 may be compared to the temperature measured at the temperature insensitive reference point 726 one at a time.

Based on the comparison, a first signal 725 may be generated by the thermal sensor 724, where the first signal 725 is a code that may be received by a digital decoder. The digital decoder may receive the first signal 725 and may generate a second signal that is used to turn on and off individual cooling modules. The digital decoder may generate the second signal by tracing back from a temperature measured in a circuit element, to a particular circuit element, to a particular chip bump, to a GDS layout stored in memory, and finally to an absorber array location.

FIG. 7C depicts a graph 730 that illustrates an example comparison between a temperature measured in a temperature insensitive reference device and a temperature measured within a particular circuit element of a three-dimensional integrated circuit (3DIC). In the graph 730, a y-axis may represent temperature, and an x-axis may represent a digital code that is generated by a thermal sensor (e.g., the thermal sensor 724 of FIG. 7B). In FIG. 7C, a critical point temperature may be a temperature measured at the temperature insensitive reference point.

As illustrated in FIG. 7C, the critical point temperature measured at the temperature insensitive reference point may be constant (e.g., the temperature measured at the temperature insensitive reference point may not change, despite other parts of the 3DIC having variable temperatures). The upward-sloping line in the graph 730 may represent, for example, the temperature measured within the particular circuit element of the 3DIC (e.g., the temperature measured in the circuit element 703 of FIG. 7A). The digital code generated by the thermal sensor may be an output that is indicative of the comparison (e.g., a digital code of "1000" may indicate that the temperature measured within the particular circuit element has exceeded the critical point temperature measured at the temperature insensitive reference point). The digital code may be received by a digital decoder, where the digital decoder may be configured to generate one or more signals to turn on or turn off individual cooling modules based on the digital code.

Figure 8B:
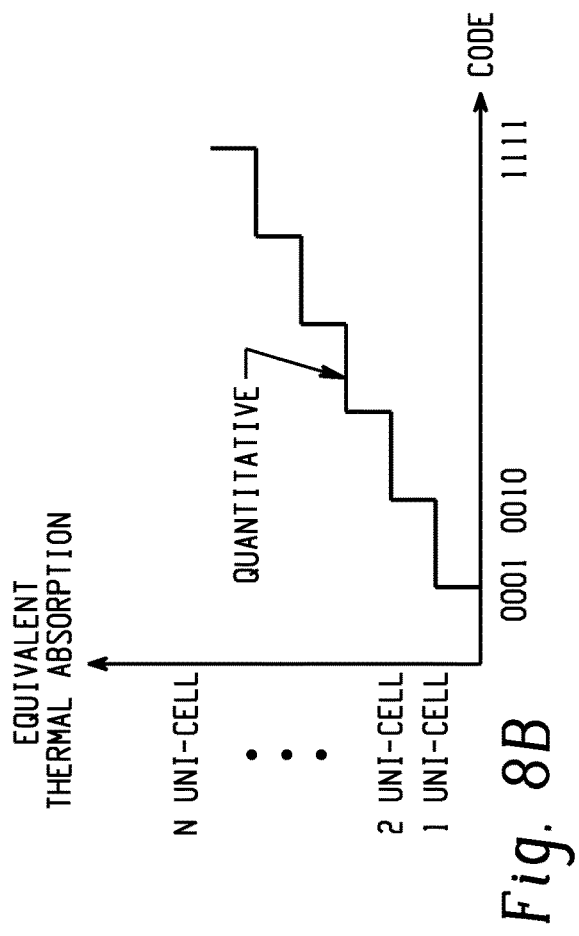
Figure 8C:
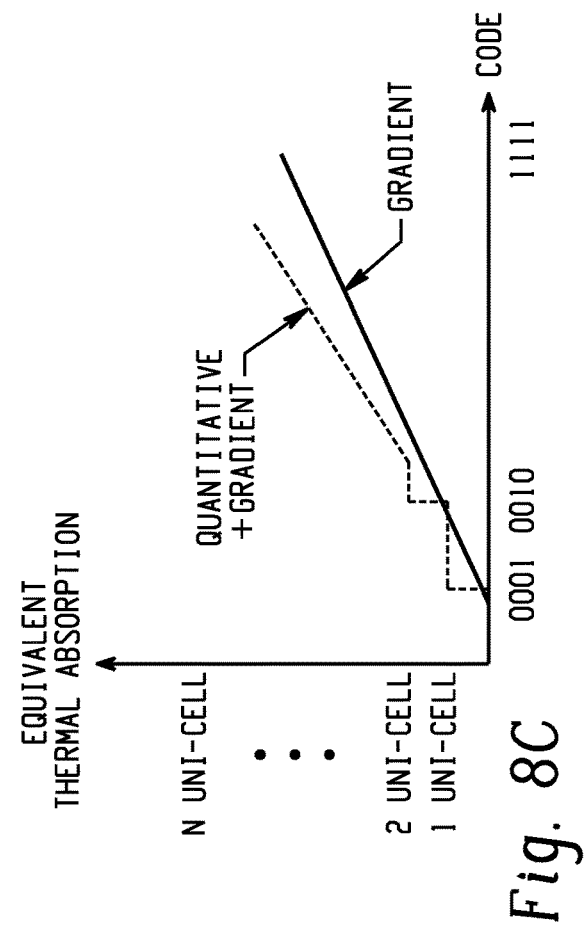
FIG. 8C depicts a graph illustrating use of a bias current applied to a cooling element to change the rate of heat absorption of the cooling element.
Figure 8A:
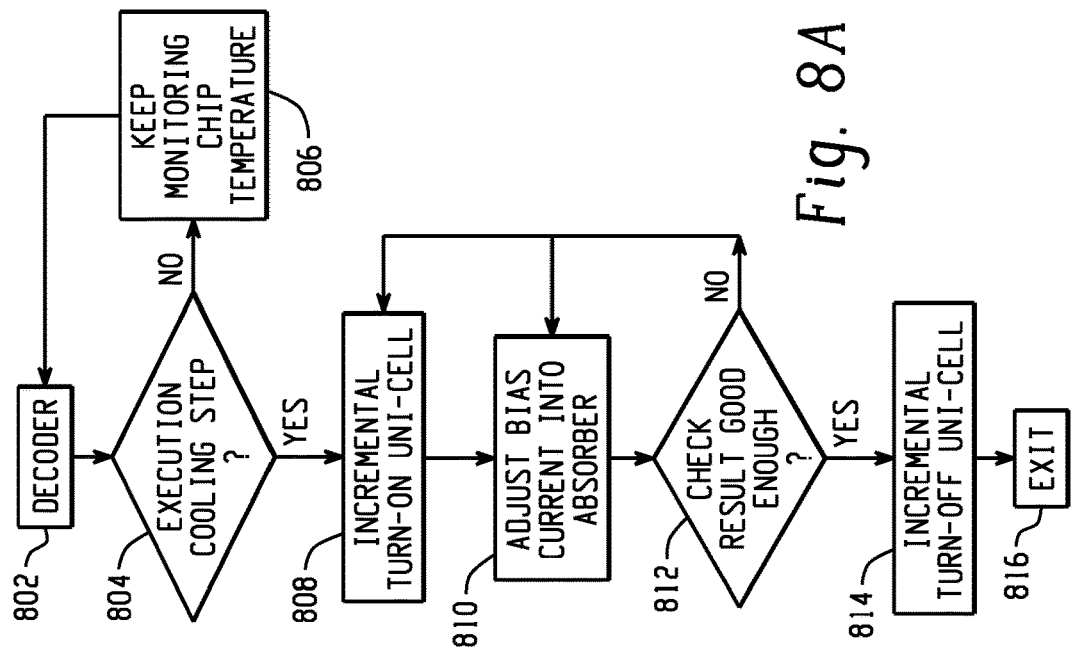
FIG. 8A depicts a flowchart illustrating an example method for cooling a 3DIC.

FIG. 8A depicts a flowchart illustrating an example method for cooling a three-dimensional integrated circuit (3DIC). As described above, with reference to FIGS. 7A, 7B, and 7C, a digital decoder may be used in determining a location of a heat spot within the 3DIC and turning on one or more cooling modules that are near the heat spot. In FIG. 8A, at 802, a decoder may receive information on temperatures measured throughout the 3DIC. The information received by the decoder may be, for example, a code that is indicative of a comparison between a temperature threshold and a temperature measured at a particular place in the 3DIC. At 804, based on the information on the measured temperatures, a determination may be made as to whether to execute a cooling step. If no cooling step is to be executed, at 806, temperatures within the 3DIC may continue to be monitored.

If the cooling step is to be executed, at 808, a single cooling module (e.g., a single uni-cell) may be turned on. Further, if the cooling step is to be executed, at 810, a bias current into the single cooling module may be adjusted. By changing the bias current into the single cooling module, a rate of heat absorption within the single cooling module may be controlled (e.g., a higher bias current may cause an increased rate of heat removal from the 3DIC). If multiple cooling modules have been enabled, at step 810, the bias current into one or all of the enabled cooling modules may be adjusted.

At 812, a result of the cooling step may be evaluated. If the result is determined to be unacceptable, another single cooling module may be turned on at 808, or the bias current received by one or all of the cooling modules may be adjusted at 810. In this manner, an optimal cooling performance may be achieved by controlling both the number of cooling modules that are enabled and also the bias current into the enabled cooling modules. For example, an optimal rate of thermal absorption may be achieved by controlling these two parameters. If the result of the cooling step is determined to be acceptable, at 814, one or more single cooling modules may be turned off. The cooling modules may be turned off in an incremental manner (e.g., a single cooling cell may be turned off at a time), or alternatively, multiple cooling cells may be turned off simultaneously. At 816, the method for cooling the 3DIC may be exited.

FIG. 8B depicts a graph illustrating an increase in thermal absorption of a cooling element as additional individually controllable cooling modules of the cooling element are turned on. As described above with reference to several of the preceding figures, a structure for cooling a three-dimensional integrated circuit (3DIC) may include a cooling element configured for thermal connection to the 3DIC, where the cooling element includes a plurality of individually controllable cooling modules. The individually controllable cooling modules may be placed at various locations relative to the 3DIC and may include, for example, a cold pole configured to absorb heat from the 3DIC.

In the graph of FIG. 8B, a y-axis may represent heat absorption (e.g., relative thermal absorption) in the cooling element, and an x-axis may represent a digital code that is configured to generate one or more signals to turn on or turn off individual cooling modules. As depicted in FIG. 8B, the heat absorption in the cooling element may have a "stair-step" pattern, where the heat absorption in the cooling element increases by a particular amount with the enablement of each additional cooling module.

FIG. 8C depicts a graph illustrating use of a bias current applied to a cooling element to change the rate of heat absorption of the cooling element. In the graph of FIG. 8C, a y-axis may represent heat absorption (e.g., relative thermal absorption) in the cooling element, and an x-axis may represent a digital code that is used to turn on certain individual cooling modules. As depicted in FIG. 8C, by changing the bias current into the cooling element, a rate of heat absorption may be controlled. In particular, by using the bias current, the stair-step pattern depicted in FIG. 8B may not be evident, and instead, the heat absorption may take on a user-defined pattern (e.g., a linear, increasing curve, as depicted in FIG. 8C). Various other user-defined patterns may be defined by controlling the bias current applied to the cooling element (e.g., linear curves with different slopes, etc.)

FIGS. 9A, 9B, 9C, 9D, and 9E depict different example topologies for implementing an individually controllable cooling module with a vertical arrangement. In each of the topologies depicted in FIGS. 9A-9E, the cooling module may include portions that are integrated within device layers of the 3DIC (e.g., portions that are embedded within device layers D1 and D2 of the 3DIC), and a cold pole of the cooling module may include a portion that is located at an interface between the device layers of the 3DIC. Additionally, in each of FIGS. 9A-9E, the individually controllable cooling module may include an N-type semiconductor element and a P-type semiconductor element that are located at two separate layers that are stacked vertically, where the N-type semiconductor element and the P-type semiconductor element are separated vertically by a cold pole. The N- and P-type semiconductor elements may couple the cold pole to portions of a heat sink that are located above a top device layer of a 3DIC and beneath a bottom device layer of the 3DIC.

Figure 9A:
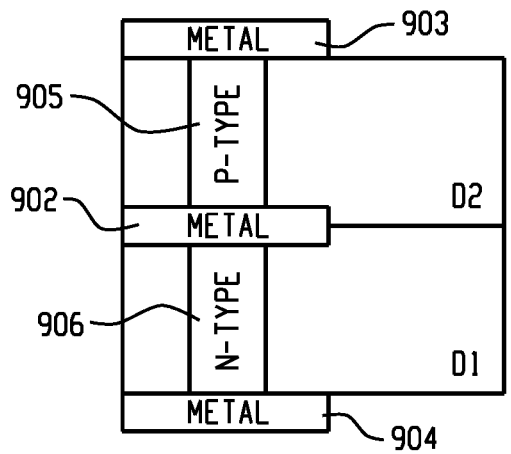
FIGS. 9A, 9B, 9C, 9D, and 9E depict different example topologies for implementing an individually controllable cooling module with a vertical arrangement.

FIG. 9A depicts first and second device layers D1 and D2 stacked vertically. A first example topology depicted in FIG. 9A may include a cold pole 902 located at an interface between the layers D1 and D2, where the cold pole 902 may comprise a first metal structure. Portions 903, 904 of a heat sink may be disposed over the device layer D2 and beneath the device layer D1 and may comprise second and third metal structures, respectively. P-type and N-type semiconductor elements 905, 906 may couple the cold pole 902 to the portions 903, 904 of the heat sink. As depicted in FIG. 9A, the P- and N-type semiconductor elements 905, 906 may be embedded within the device layers D2 and D1 respectively.

Figure 9B:
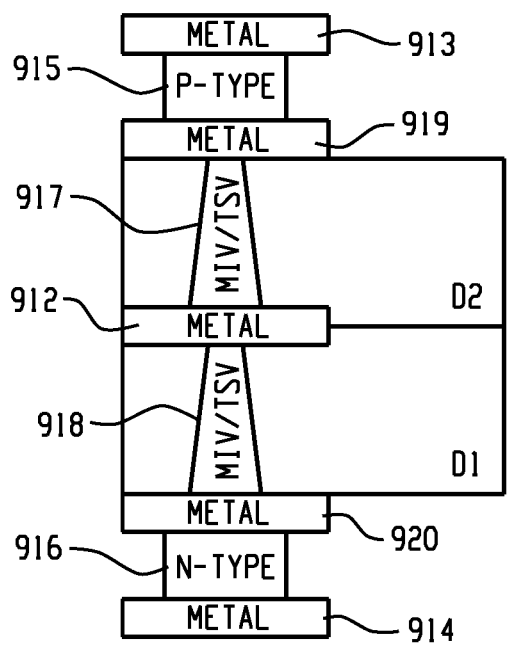

FIG. 9B depicts a second example topology, where a cold pole may include i) a first metal structure 912 located at an interface between the device layers D1 and D2, ii) a second metal structure 919 disposed over the device layer D2, iii) a third metal structure 920 disposed beneath the device layer D1, and iv) first and second through silicon vias (TSVs) 917, 918 that couple the first metal structure 912 with each of the second and third metal structures 919, 920. A P-type semiconductor element 915 may be disposed over the device layer D2, where the P-type semiconductor element 915 may be configured to couple the second metal structure 919 to a portion 913 of a heat sink. An N-type semiconductor element 916 may be disposed beneath the device layer D1, where the N-type semiconductor element 916 may be configured to couple the third metal structure 920 to a portion 914 of the heat sink.

Figure 9C:
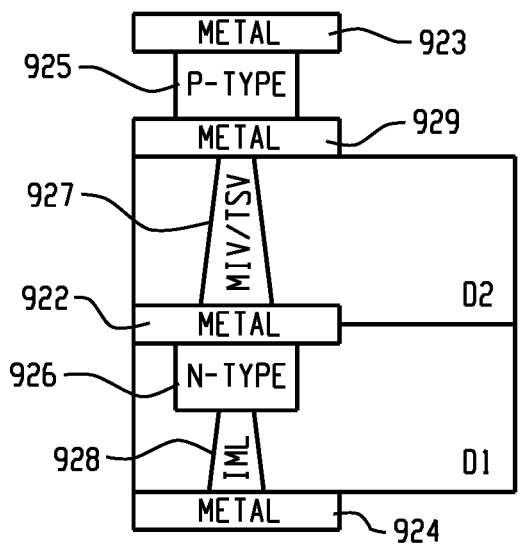

FIG. 9C depicts a third example topology, where a cold pole may include i) a first metal structure 922 located at an interface between a first device layer D1 and a second device layer D2, ii) a second metal structure 929 disposed over the second device layer D2, and iii) a through silicon via (TSV) 927 that couples the first metal structure 922 with the second metal structure 929. An inter metal layer 928 may be located between the cold pole and a portion 924 of a heat sink that is disposed beneath the first device layer D1. An N-type semiconductor element 926 may couple the inter metal layer 928 with the first metal structure 922. A P-type semiconductor element 925 may be disposed over the second device layer D2 and may couple the third metal structure 929 of the cold pole with a portion 923 of the heat sink that is disposed over the top device layer.

Figure 9D:
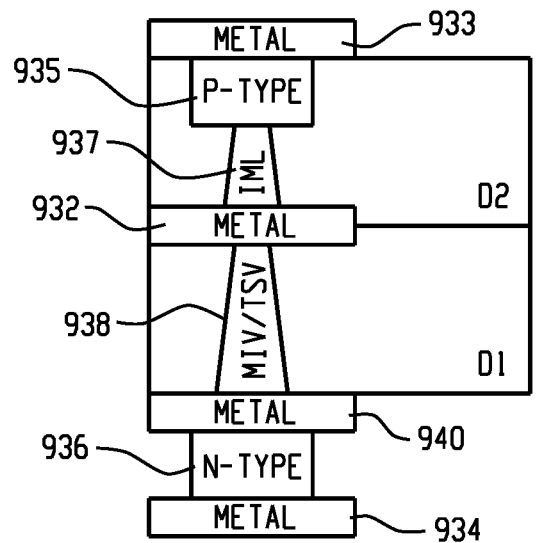

FIG. 9D depicts a fourth example topology, where a cold pole may include i) a first metal structure 932 that is located at an interface between a first device layer D1 and a second device layer D2, ii) a second metal structure 940 that is disposed beneath the first device layer, and iii) a through silicon via (TSV) 938 that couples the first metal structure 932 with the second metal structure 940. An inter metal layer 937 is disposed between the cold pole and a portion 933 of a heat sink that is disposed over the second device layer D2. An N-type semiconductor element 936 may be disposed beneath the first device layer D1 and may couple the second metal structure 940 with a portion 934 of the heat sink that is disposed beneath the first device layer D1. A P-type semiconductor element 935 may couple the inter metal layer 937 with the portion 933 of the heat sink that is disposed over the second device layer 933.

Figure 9E:
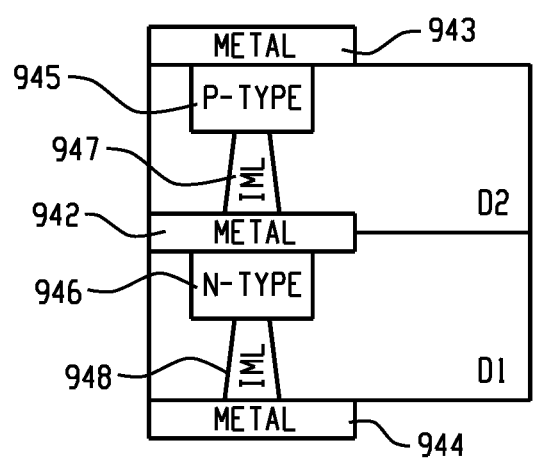

FIG. 9E depicts a fifth example topology, where a cold pole may include a first metal structure 942 located at an interface between a first device layer D1 and a second device layer D2. A first inter metal layer 947 may be disposed between the cold pole and a portion 943 of a heat sink that is disposed over the second device layer D2. A second inter metal layer 948 may be disposed between the cold pole and a portion 944 of the heat sink that is disposed beneath the first device layer D1. A P-type semiconductor element 945 may couple the first inter metal layer 947 with the portion 943 of the heat sink disposed over the second device layer D2. An N-type semiconductor element 946 may couple the first metal structure 942 with the second inter metal layer 948.

It is noted that in FIGS. 9A-9E, various of the elements may be rearranged without affecting the cooling properties of the different topologies. For example, the N-type semiconductor elements and the P-type semiconductor elements may be switched in position. Other modifications may be made (e.g., elements embedded within the device layer D2 may be included in the device layer D1, and vice versa; elements from any of the different topologies may be combined to form different topologies; etc.).

Figure 10A:
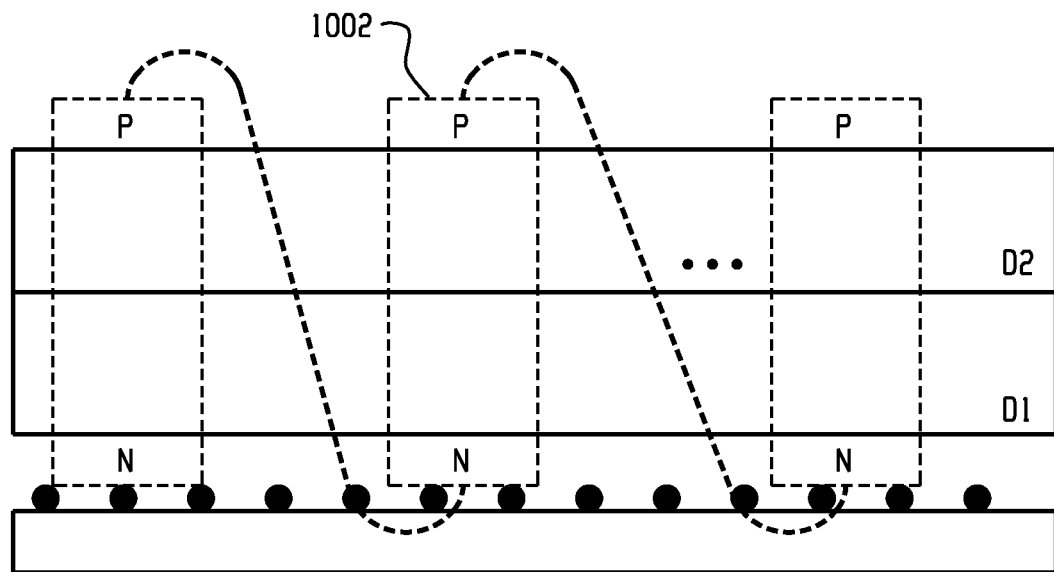
FIGS. 10A and 10B depict a plurality of connected cooling modules, where the cooling modules include a vertical arrangement of elements.
Figure 10B:
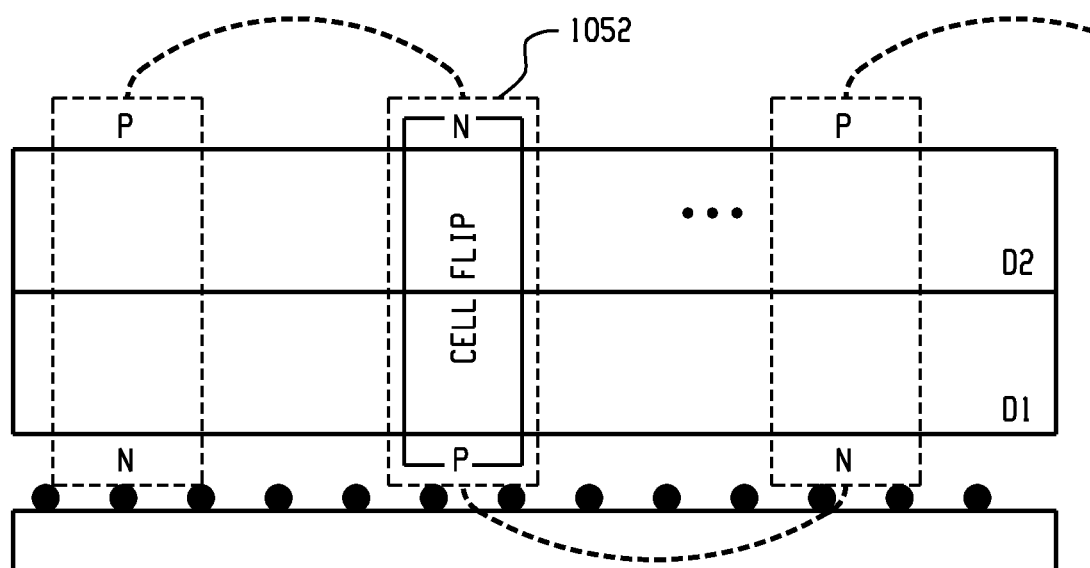

FIGS. 10A and 10B depict a plurality of connected cooling modules 1002, 1052, where the cooling modules 1002, 1052 include a vertical arrangement of elements. The vertical arrangement of elements for the cooling modules 1002, 1052 may be the same or similar to the arrangement illustrated in FIG. 1E, or the vertical arrangement may be the same or similar to the arrangements illustrated in FIGS. 9A-9E, for example. The cooling modules 1002, 1052 may thus have a cold pole that includes a portion at the interface between the device layers D1 and D2 and heat sink portions above the top layer D2 and beneath the bottom layer D1.

Further, as illustrated in FIGS. 10A and 10B, the cooling modules 1002, 1052 may include an N-type semiconductor element and a P-type semiconductor element that are stacked vertically, and the two semiconductor elements may be separated vertically by the cold pole. A direction of current flow in the N- and P-type elements may dictate positions of the cold pole and the heat sink portions. For example, if current is caused to flow from the N-type semiconductor element to the P-type semiconductor element, then the cold pole may be located at the interface between the device layers D1 and D2. By contrast, if current is caused to flow from the P-type semiconductor element to the N-type semiconductor element, then the heat sink may be located at the interface.

In FIG. 10A, the cooling modules 1002 may be arranged in a "sequential type" arrangement. In the sequential type arrangement, each cooling module 1002 may be arranged with a P-type semiconductor element that is located above an N-type semiconductor element (i.e., none of the cooling modules 1002 are flipped to include the N-type semiconductor element above the P-type semiconductor element). The cooling modules 1002 may be electrically connected (e.g., via bond wire connection) to each other, as depicted in FIG. 10A.

In FIG. 10B, the cooling modules 1052 may be arranged in a "flip type" arrangement. In the flip type arrangement, the cooling modules 1052 may alternate between having a P-type semiconductor element above an N-type semiconductor element, and between having the N-type semiconductor element above the P-type semiconductor element. The cooling modules 1052 may be electrically connected (e.g., by a back end of line metal layer) to each other, as depicted in FIG. 10B.

Figure 11:
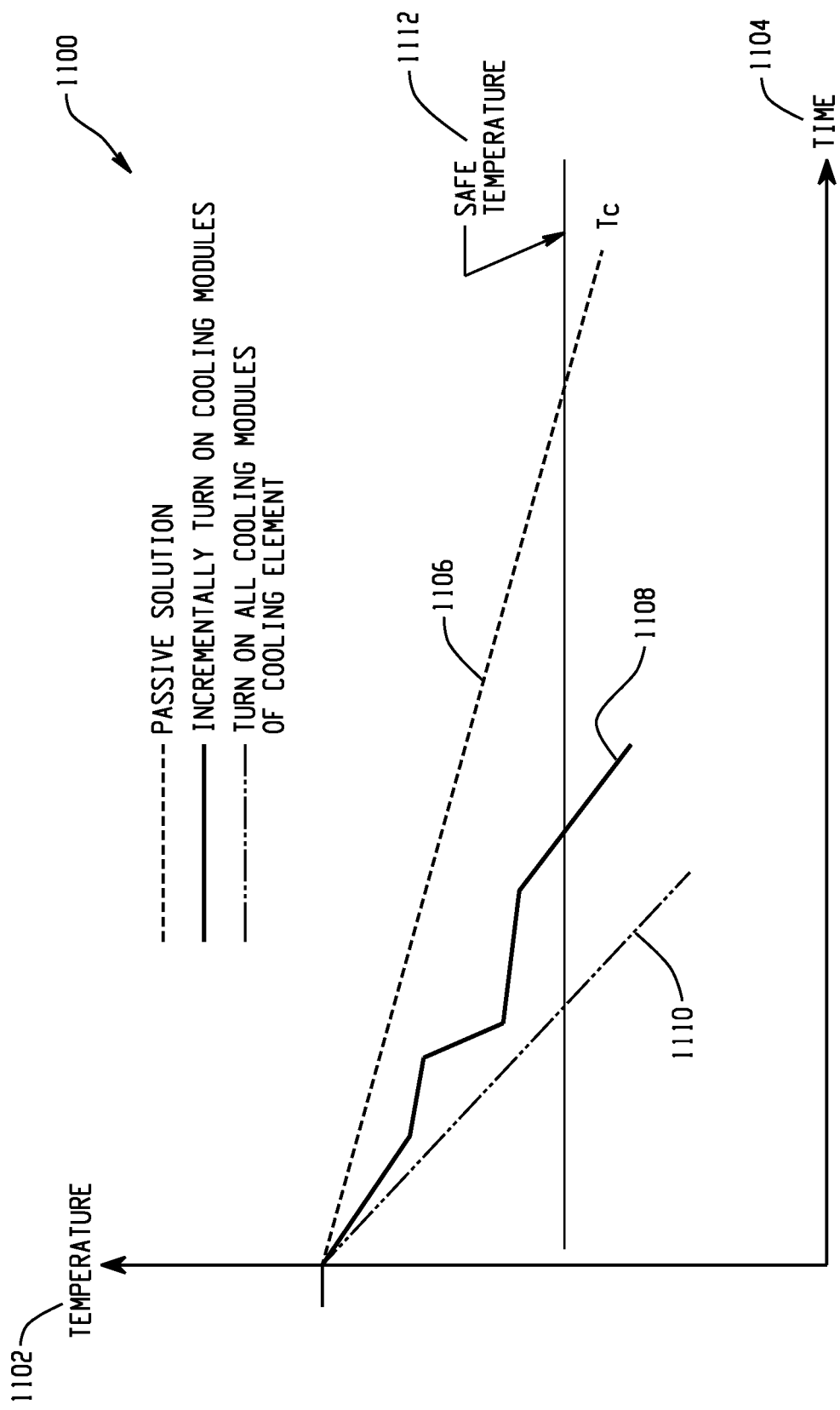
FIG. 11 depicts a graph illustrating a temperature of a 3DIC versus time.

FIG. 11 depicts a graph 1100 illustrating a temperature of a three-dimensional integrated circuit (3DIC) versus time. In FIG. 11, a y-axis 1102 may represent the temperature of the 3DIC, and an x-axis 1104 may represent the time. Specifically, the graph 1100 includes three temperature curves 1106, 1108, 1110, where each of the three curves 1106, 1108, 1110 depicts a decrease in temperature in the 3DIC as caused by a different cooling methodology. The curve 1106 may represent a temperature decease caused by a traditional methodology for cooling the 3DIC, where a cooling element may comprise a thermal absorption material that is passive (e.g., the thermal absorption material is placed over a top device layer of the 3DIC, and no current or voltage is applied to the thermal absorption material). The temperature of the curve 1106 may decrease linearly with time, with a slope that is relatively gradual.

By contrast, the curve 1108 may represent a temperature decrease caused by a dynamic methodology for cooling the 3DIC, where a cooling element may include a plurality of individually controllable cooling modules that are turned on and off based on temperatures measured within the 3DIC. The curve 1108 may not include a single linear decrease in temperature, as illustrated in FIG. 11. The curve 1110 may represent a temperature decrease caused by a third methodology for cooling the 3DIC, where all cooling modules included in a plurality of cooling modules are turned on simultaneously. The temperature of the curve 1110 may decrease linearly with time, with a slope that is relatively steep.

A safe temperature 1112 is depicted in the graph 1110. A time in which the curves 1106, 1108, 1110 cross the safe temperature 1112 may illustrate a rate of cooling for the three methodologies. Use of passive absorbers, as illustrated in the curve 1106, may cool the 3DIC at the lowest rate, while use of all cooling modules simultaneously, as illustrated in the curve 1110, may cool the 3DIC at the highest rate. As illustrated in the curve 1108, by turning on and off cooling modules on an individual basis (e.g., rather than turning on and off all cooling modules simultaneously), a time interval for performing cooling procedures in the 3DIC may be controlled and predicted. The control and prediction of the time interval for cooling procedures may make thermal control in the 3DIC more reliable, uniform, and safe. Further, a thermal stress of the entire 3DIC chip may be controlled by the adaptive methodology of incrementally turning on cooling modules.

Figure 12:
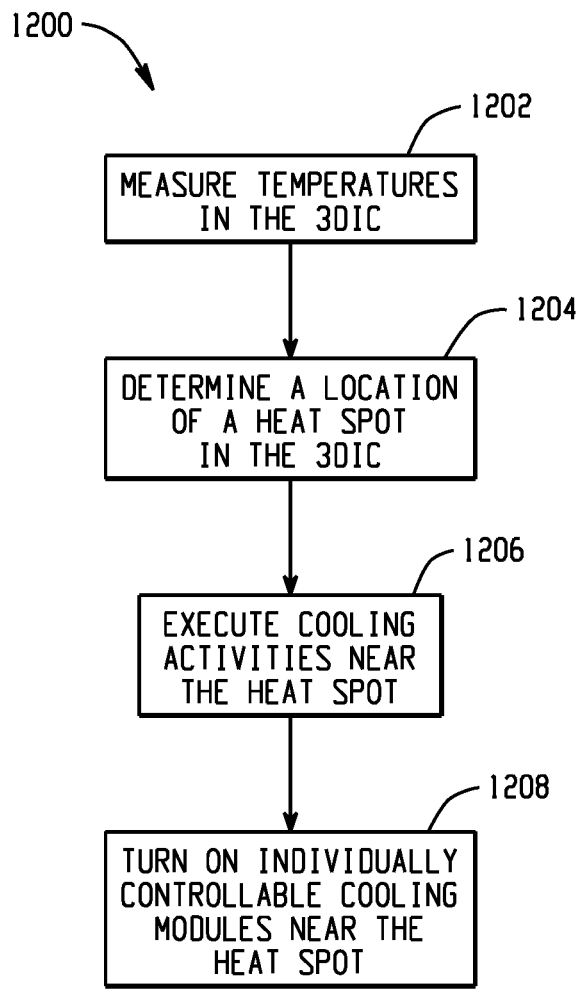
FIG. 12 is a flowchart illustrating an example method for cooling a 3DIC.

FIG. 12 is a flowchart 1200 illustrating an example method for cooling a three-dimensional integrated circuit (3DIC). At 1202, temperatures are measured at a plurality of locations in the 3DIC. At 1204, a location of a heat spot within the 3DIC is determined based on the measured temperatures. At 1206, cooling activities are executed near the location of the heat spot, where the cooling activities are executed by a cooling element that includes a plurality of individually controllable cooling modules. At 1206, in performing the cooling activities, certain of the individually controllable cooling modules near the location of the heat spot are turned on.

As described above, the present disclosure is directed to example structures and methods for cooling a 3DIC. In one example, a structure for cooling a 3DIC may include a cooling element configured for thermal connection to the 3DIC. The cooling element may include a plurality of individually controllable cooling modules disposed at a first plurality of locations relative to the 3DIC. Each of the cooling modules may include a cold pole and a heat sink. The cold pole may be configured to absorb heat from the 3DIC. The heat sink may be configured to dissipate the heat absorbed by the cold pole and may be coupled to the cold pole via an N-type semiconductor element and via a P-type semiconductor element. The structure may further include a temperature sensing element including a plurality of thermal monitoring elements disposed at a second plurality of locations relative to the 3DIC for measuring temperatures at the second plurality of locations. The measured temperatures may control the plurality of cooling modules.

In another example, a structure for cooling a 3DIC may include a cooling module configured for thermal connection to the 3DIC. The 3DIC may include a first device layer and a second device layer stacked vertically over a substrate, where the first and the second device layers may be separated by an interface. The cooling module may include a first metal structure configured to absorb heat from the 3DIC, where the first metal structure may include a portion that is located at the interface. The cooling module may also include a second metal structure configured to dissipate the heat absorbed by the first metal structure. The second metal structure may be coupled to the first metal structure via an N-type semiconductor element and via a P-type semiconductor element. The second metal structure may include portions that are disposed over the second device layer and disposed beneath the first device layer. The cooling module may further include the N-type semiconductor element and the P-type semiconductor element that are stacked vertically. The N-type semiconductor element and the P-type semiconductor element may be separated vertically by the first metal structure. A thermal monitoring element may be configured to measure a temperature of the 3DIC, and the measured temperature may control the cooling module.

In another example, in a method for cooling a 3DIC, temperatures may be measured at a plurality of locations in the 3DIC. A location of a heat spot may be determined within the 3DIC based on the measured temperatures. Cooling activities may be executed near the location of the heat spot, where the cooling activities may be executed by a cooling element that includes a plurality of individually controllable cooling modules. Certain of the individually controllable cooling modules near the location of the heat spot may be turned on.

This written description uses examples to disclose the disclosure, including the best mode, and also to enable a person skilled in the art to make and use the disclosure. The patentable scope of the disclosure may include other examples. It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Further, as used in the description herein and throughout the claims that follow, the meaning of "each" does not require "each and every" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive of" may be used to indicate situations where only the disjunctive meaning may apply.

What is claimed is:

1. A method for cooling a three-dimension integrated circuit (3DIC), the method comprising:
    measuring a temperature at a first location of a first semiconductor device; and
    cooling the first location of the first semiconductor device utilizing a first cooling structure, wherein during the cooling the first location of the first semiconductor device a second cooling structure is not activated, the first cooling structure comprising:
        a metal cold pole:
        a p-type semiconductor material on a first side of the metal cold pole; and
        an n-type semiconductor material on a second side of the metal cold pole opposite the first side, the metal cold pole being located at an interface between the first semiconductor device and a second semiconductor device.

2. The method of claim 1, wherein the cooling the first location applies a first bias current to the first cooling structure.

3. The method of claim 2, further comprising evaluating a result of the cooling the first location.

4. The method of claim 3, further comprising modifying the first bias current to a second bias current after the evaluating the result of the cooling the first location.

5. The method of claim 3, further comprising activating a second cooling structure after the evaluating the result of the cooling the first location.

6. The method of claim 1, further comprising deactivating the first cooling structure.

7. The method of claim 1, further comprising removing heat from the first semiconductor device through a passive heat removal device.

8. A method for cooling a three-dimension integrated circuit (3DIC), the method comprising:
    measuring a temperature at a first location of a first semiconductor device, wherein a second location of the first semiconductor device is not measured; and
    activating a first cooling structure adjacent to the first location without activating a second cooling structure adjacent to the second location, wherein the first cooling structure comprises a metal cold pole sandwiched between a p-type semiconductor material and an n-type semiconductor material, the metal cold pole being located at an interface between the first semiconductor device and a second semiconductor device.

9. The method of claim 8, wherein the activating the first cooling structure further comprises applying a first bias current to the first cooling structure.

10. The method of claim 9, further comprising, after the activating the first cooling structure, evaluating a result of the activating the first cooling structure.

11. The method of claim 10, further comprising, after the evaluating the result of the activating the first cooling structure, applying a second bias current to the first cooling structure, the second bias current being different from the first bias current.

12. The method of claim 10, further comprising, after the evaluating the result of the activating the first cooling structure, activating the second cooling structure.

13. The method of claim 10, further comprising, after the evaluating the result of the activating the first cooling structure, deactivating the first cooling structure.

14. The method of claim 8, further comprising removing heat from the first semiconductor device utilizing a passive heat removal device.

15. A method for cooling a three-dimension integrated circuit, the method comprising:
    locating a heat spot within a first semiconductor device, the first semiconductor device having an interface with a second semiconductor device;
    cooling the heat spot by applying a current to a cooling device, the cooling device comprising:
        a first heat sink at a first side of the first semiconductor device;
        an n-type semiconductor device extending at least part of the way through the first semiconductor device;
        a cold pole located at the interface;

a p-type semiconductor device on an opposite side of the cold pole than the n-type semiconductor device; and a second heat sink on an opposite side of the second semiconductor device from the interface.

16. The method of claim 15, further comprising modifying the current being applied to the cooling device.

17. The method of claim 15, wherein the applying the current to the cooling device additionally applies the current to a second cooling device.

18. The method of claim 15, wherein the locating the heat spot comprises receiving a signal from a thermal monitoring element.

19. The method of claim 18, wherein the locating the heat spot further comprises comparing a temperature from the thermal monitoring element to a reference temperature.

20. The method of claim 19, wherein the reference temperature is a temperature measured at a temperature insensitive reference point.

* * * * *